United States Patent
Teramoto et al.

(10) Patent No.: US 9,230,799 B2
(45) Date of Patent: Jan. 5, 2016

(54) METHOD FOR FABRICATING SEMICONDUCTOR DEVICE AND THE SEMICONDUCTOR DEVICE

(75) Inventors: Akinobu Teramoto, Sendai (JP); Hiroshi Kambayashi, Yokohama (JP); Hirokazu Ueda, Sendai (JP); Yuichiro Morozumi, Nirasaki (JP); Katsushige Harada, Nirasaki (JP); Kazuhide Hasebe, Nirasaki (JP); Tadahiro Ohmi, Sendai (JP)

(73) Assignees: TOHOKU UNIVERSITY, Sendai-shi (JP); Fuji Electric Co., Ltd., Kawasaki-shi (JP); TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 13/981,048

(22) PCT Filed: Jan. 23, 2012

(86) PCT No.: PCT/JP2012/051348
§ 371 (c)(1),
(2), (4) Date: Jul. 22, 2013

(87) PCT Pub. No.: WO2012/102237
PCT Pub. Date: Aug. 2, 2012

(65) Prior Publication Data
US 2013/0292700 A1    Nov. 7, 2013

(30) Foreign Application Priority Data
Jan. 25, 2011 (JP) ................................. 2011-013066

(51) Int. Cl.
*H01L 29/20* (2006.01)
*H01L 21/02* (2006.01)
(Continued)

(52) U.S. Cl.
CPC ........ *H01L 21/02274* (2013.01); *H01L 21/022* (2013.01); *H01L 21/0228* (2013.01);
(Continued)

(58) Field of Classification Search
CPC ............... H01L 29/66462; H01L 29/7787; H01L 29/4236; H01L 21/823857; H01L 29/778; H01L 21/28194
USPC .................................. 257/E21.409; 438/197
See application file for complete search history.

(56) References Cited

U.S. PATENT DOCUMENTS

2004/0161899 A1*  8/2004  Luo et al. ...................... 438/287
2008/0296724 A1* 12/2008  Yamazaki et al. ............ 257/506
(Continued)

FOREIGN PATENT DOCUMENTS

JP      05 304292       11/1993
JP      2008 103408      5/2008
(Continued)

OTHER PUBLICATIONS

Uesugi, T. et al., "Deposition of aluminum, oxide layer on GaN using diethyl aluminum ethoxide as a precursor", AIP, Journal of Applied Physics, vol. 104, pp. 016103-1-016103-3, (Jul. 2, 2008).
(Continued)

*Primary Examiner* — Khaja Ahmad
(74) *Attorney, Agent, or Firm* — Oblon, McClelland, Maier & Neustadt, L.L.P.

(57) ABSTRACT

A method for fabricating a semiconductor device including GaN (gallium nitride) that composes a semiconductor layer and includes forming a gate insulating film, in which at least one film selected from the group of a $SiO_2$ film and an $Al_2O_3$ film is formed on a nitride layer containing GaN by using microwave plasma and the formed film is used as at least a part of the gate insulating film.

11 Claims, 15 Drawing Sheets

(51) Int. Cl.
| | |
|---|---|
| *H01L 21/28* | (2006.01) |
| *H01L 29/66* | (2006.01) |
| *H01L 29/778* | (2006.01) |
| *H01L 29/423* | (2006.01) |
| *H01L 23/00* | (2006.01) |
| *H01L 29/205* | (2006.01) |
| *H01L 29/51* | (2006.01) |

(52) U.S. Cl.
CPC ...... *H01L21/0254* (2013.01); *H01L 21/02164* (2013.01); *H01L 21/02178* (2013.01); *H01L 21/28264* (2013.01); *H01L 23/564* (2013.01); *H01L 29/2003* (2013.01); *H01L 29/205* (2013.01); *H01L 29/42364* (2013.01); *H01L 29/51* (2013.01); *H01L 29/517* (2013.01); *H01L 29/66462* (2013.01); *H01L 29/778* (2013.01); *H01L 29/7787* (2013.01); *H01L 29/513* (2013.01); *H01L 2924/0002* (2013.01)

(56) References Cited

U.S. PATENT DOCUMENTS

| | | | |
|---|---|---|---|
| 2008/0308813 A1* | 12/2008 | Suh et al. | 257/76 |
| 2009/0120581 A1* | 5/2009 | Qin et al. | 156/345.24 |
| 2009/0246971 A1* | 10/2009 | Reid et al. | 438/778 |
| 2009/0289349 A1* | 11/2009 | Novotny et al. | 257/698 |
| 2010/0055347 A1* | 3/2010 | Kato et al. | 427/569 |
| 2010/0062592 A1* | 3/2010 | Clark | 438/591 |
| 2010/0091428 A1* | 4/2010 | Kim et al. | 361/313 |
| 2010/0159656 A1* | 6/2010 | Nakata et al. | 438/268 |
| 2010/0239782 A1* | 9/2010 | Sasaki et al. | 427/575 |
| 2011/0053381 A1 | 3/2011 | Kobayashi et al. | |
| 2011/0068371 A1 | 3/2011 | Oka | |
| 2011/0081500 A1* | 4/2011 | Zhao et al. | 427/535 |
| 2011/0133205 A1* | 6/2011 | Nagahisa et al. | 257/76 |
| 2011/0174770 A1* | 7/2011 | Hautala | 216/13 |
| 2011/0206590 A1 | 8/2011 | Honda et al. | |
| 2012/0126376 A1 | 5/2012 | Honda et al. | |

FOREIGN PATENT DOCUMENTS

| | | |
|---|---|---|
| JP | 2008 112750 | 5/2008 |
| JP | 2008 277640 | 11/2008 |
| JP | 2009-16688 A | 1/2009 |
| JP | 2009 064821 | 3/2009 |
| JP | 2009 076673 | 4/2009 |
| JP | 2010-192633 | 9/2010 |
| JP | 2010-192934 | 9/2010 |
| JP | 2010-232377 | 10/2010 |
| JP | 2010-239102 A | 10/2010 |
| WO | WO2009/099252 | 8/2009 |
| WO | WO 2010/038887 A1 | 4/2010 |
| WO | WO 2010/038900 A1 | 4/2010 |

OTHER PUBLICATIONS

International Search Report Issued Apr. 10, 2012 in PCT/JP12/051348 Filed Jan. 23, 2012.

V. Adivarahan, et al., "Digital oxide deposition of $SiO_2$ layers for III-nitride metal-oxide-semiconductor heterostructure field-effect transistors", Applied Physics Letters 88, 2006, pp. 182507-1 to 182507-3.

Office Action issued in related U.S. Appl. No. 14/474,835, dated May 7, 2015.

* cited by examiner

METHOD FOR FABRICATING SEMICONDUCTOR DEVICE AND THE SEMICONDUCTOR DEVICE

BACKGROUND OF THE INVENTION

This invention relates to a method for fabricating a semiconductor device and the semiconductor device.

TECHNICAL FIELD

Recently, semiconductor devices with an active layer made of GaN (gallium nitride)-based materials, or group III-V compounds, have been actively developed. The GaN-based nitrides have a wider band gap than GaAs (gallium arsenide)-based nitrides, which are the same group III-V compounds used as a material of the semiconductor devices. Such GaN-based nitrides with a wide band gap are being actively developed to find applications especially in a field of short wavelength light-emitting materials. The GaN-based semiconductor devices include AlGaN (aluminum gallium nitride)/GaN-based semiconductor devices with a heterojunction made of dissimilar materials.

These GaN-based semiconductor devices can achieve relatively high field effect mobility. This property of the GaN-based semiconductor devices have captured attention in semiconductor device development aiming at low operation power and low power consumption.

Other properties required for the GaN-based power semiconductor devices are normally-off operation, low ON-resistance, low interface state density, high dielectric breakdown voltage, and so on. In order to obtain the properties, gate insulating films formed on the GaN-based semiconductor devices are also required to have the properties that satisfy the aforementioned requirements.

One possible way to form the gate insulating film on a GaN-based semiconductor device is to oxidize the outermost surface of a GaN layer, which is a semiconductor layer, to form an oxide film, i.e., a $Ga_2O_3$ (gallium oxide) film and use the oxide film as the gate insulating film. However, $Ga_2O_3$ has a band gap of approximately 4.8 eV only. In addition, $Ga_2O_3$ has a conduction band offset (hereinafter sometimes referred to as "$\Delta Ec$"), which is energy band discontinuity on the conduction band side of GaN, of approximately 0.5 eV and a valence band offset (hereinafter sometimes referred to as "$\Delta Ev$"), which is energy band discontinuity on the valence band side of GaN, of approximately 1.1 eV. Even if a $Ga_2O_3$ film of high quality can be formed, it is not preferable to employ the $Ga_2O_3$ film having small band gap $\Delta Ec$ and $\Delta Ev$ as a gate insulating film in terms of current leakage. Thus, what is needed to form a GaN-based semiconductor device functioning as a good semiconductor element is to form an insulating film having a large band gap and so on as a gate insulating film on the upper side of a GaN layer, which is a semiconductor layer, rather than to form the $Ga_2O_3$ film as the gate insulating film by oxidation of the outermost surface of the GaN layer.

A technology of a nitride compound semiconductor transistor, more specifically, an AlGaN/GaN-based heterojunction transistor is disclosed in Japanese Unexamined Patent Publication No. 2008-103408 (PTL 1). A technology of a nitride semiconductor element is disclosed in Japanese Unexamined Patent Publication No. 2008-277640 (PTL 2).

The nitride compound semiconductor transistor disclosed in PTL 1 is obtained by forming a double-layer gate insulating film on a nitride compound semiconductor layer. Specifically, the double-layer gate insulating film is composed of a first gate insulating film that is a silicon nitride film formed on the nitride compound semiconductor layer and a second gate insulating film that is formed on the silicon nitride film and is made of a material having higher breakdown strength than the silicon nitride film. According to the structure, since the interface state density between the silicon nitride film formed on the lower side and the nitride compound semiconductor layer is reduced and the gate insulating film formed on the upper side is made of the material with high breakdown strength, the transistor can achieve high mobility in a channel region and low ON-resistance.

In addition, the nitride semiconductor element disclosed in PTL 2 is characterized by including a field isolation film containing silicon and a gate insulating film not containing silicon. Specifically, the gate insulating film is composed of, for example, AlN (aluminum nitride) and some other materials, instead of silicon. The exclusion of silicon can maintain the concentration of 2DEG (Two Dimensional Electron Gas) in a region immediately under the gate electrode relatively low and the concentration of 2DEG in an offset region relatively high to achieve both the normally-off operation and low ON-resistance.

CITATION LIST

Patent Literature

PTL1: Japanese Unexamined Patent Publication No. 2008-103408
PTL2: Japanese Unexamined Patent Publication No. 2008-277640

SUMMARY OF THE INVENTION

Technical Problem

In PTL 1 described above, the silicon nitride film, as represented by SiN (silicon nitride), which is one layer in the double-layer gate insulating film, needs to be formed precisely. However, it is very difficult to properly form such a silicon nitride film containing nitrogen while maintaining the aforementioned properties.

In PTL 2, the gate insulating film does not include silicon, but includes, concretely, AlN or the like. However, such a gate insulating film containing AlN or the like is not always appropriate to use as a gate insulating film of the GaN-based nitride semiconductor element in terms of the required high breakdown voltage.

An available material having a large band gap for the GaN-based semiconductor device is a silicon dioxide film ($SiO_2$ film). The silicon dioxide film can be formed on the upper side of the GaN by a CVD (Chemical Vapor Deposition) process by using plasma generated by an ECR (Electron Cyclotron Resonance) apparatus or by a CVD process using CCP (Capacitively Coupled Plasma) as represented by a parallel plate apparatus. The silicon dioxide film formed on the upper side of the GaN layer through the aforementioned processes can be possibly used as a gate insulating film.

However, plasma generated by the parallel plate apparatus or the like has a relatively high electron temperature and the surface of a specimen to be processed is exposed to the high electron temperature, and therefore the surface on the processed side of the GaN layer may suffer electrical stress, such as charging damage, and physical damage caused by ion irradiation and so on during the CVD process. The damaged GaN layer induces degradation of the field effect mobility, resulting in property degradation as a GaN-based semiconductor device.

This invention has an object to provide a method for fabricating a semiconductor device with excellent properties.

Another object of the invention is to provide a semiconductor device with excellent properties.

Solution to Problem

The method for fabricating the semiconductor device according to the present invention is to fabricate a semiconductor device including GaN (gallium nitride) that composes a semiconductor layer and includes a step of forming a gate insulating film, in the step at least one film selected from the group consisting of a $SiO_2$ film and an $Al_2O_3$ film being formed on a nitride layer containing GaN by using microwave plasma and the formed film being used as at least a part of the gate insulating film.

According to the structure, when the gate insulating film of the semiconductor device is formed on the GaN layer, plasma is excited by microwave plasma. Since the plasma used for processing has a relatively low electron temperature, charging damage and other damage to the GaN-containing nitride layer, which serves as a base layer, can be significantly reduced. In addition, at least one film selected from the group consisting of the $SiO_2$ film formed by using the microwave plasma and the $Al_2O_3$ film formed by using the microwave plasma is used as at least a part of the gate insulating film, thereby improving the properties of the gate insulating film. Therefore, a semiconductor device with excellent properties can be fabricated.

Preferably, the step of forming the gate insulating film includes a plasma-enhanced CVD process using microwave plasma.

The step of forming the gate insulating film can include a plasma-enhance ALD (Atomic Layer Deposition) process using microwave plasma.

More preferably, the step of forming the gate insulating film is a step of forming a film in which a $SiO_2$ film and an $Al_2O_3$ film are stacked.

In a further preferable embodiment, the step of forming the gate insulating film is a step of forming the $Al_2O_3$ film on a nitride layer and forming the $SiO_2$ film on the formed $Al_2O_3$ film to form the gate insulating film.

In addition, the step of forming the gate insulating film may be a step of forming the $Al_2O_3$ film by a thermal ALD process and forming the $SiO_2$ film by a plasma-enhanced CVD process.

More preferably, the step of forming the gate insulating film may be a step of forming either one of the $SiO_2$ film and $Al_2O_3$ film to form the gate insulating film and may include a step of forming either one of the films by both the plasma-enhanced CVD and plasma-enhanced ALD processes.

In addition, the step of forming the gate insulating film may be a step of forming the $Al_2O_3$ film on the nitride layer by the thermal ALD process, subjecting the formed $Al_2O_3$ film to radical oxidation for a predetermined period of time, and forming the $SiO_2$ film on the radical-oxidized $Al_2O_3$ film by the plasma-enhanced CVD process to form the gate insulating film.

In addition, the step of forming the gate insulating film is a step of forming $SiO_2$ films to form the gate insulating film and may be a step of forming a first $SiO_2$ film on a nitride layer by the plasma-enhanced ALD process and forming a second $SiO_2$ film by the plasma-enhanced CVD process on the first $SiO_2$ film formed by the plasma-enhanced ALD process to form the gate insulating film including the first and second $SiO_2$ films.

The step of forming the gate insulating film preferably includes a step of introducing gas containing nitrogen atoms for processing.

In a further preferable embodiment, the plasma-enhanced ALD process includes a step of introducing deposition gas containing BTBAS (bis-tertiaryl-buthyl-amino-silane) onto the nitride layer.

The step of forming the gate insulating film preferably includes a step of successively performing the plasma-enhanced ALD and plasma-enhanced CVD processes.

In the step of forming the gate insulating film in a preferable embodiment, the microwave plasma is generated by producing microwaves at a frequency of 2.45 GHz.

More preferably, in the step of forming the gate insulating film, the microwave plasma is generated by using a radial line slot antenna (RLSA).

A step of forming the nitride layer includes a step of forming a nitride layer with a heterojunction.

More preferably, the step of forming the nitride layer includes a step of forming a nitride layer composed of a GaN layer and AlGaN (aluminum gallium nitride) layer.

The semiconductor device in another aspect of the present invention is a semiconductor device including GaN that composes a semiconductor layer and includes a nitride layer containing GaN that composes the semiconductor layer and a gate insulating film formed on the nitride layer. The gate insulating film includes at least one film selected from the group consisting of a $SiO_2$ film formed by using microwave plasma and an $Al_2O_3$ film formed by using microwave plasma.

When the gate insulating film of the semiconductor device is formed on the GaN layer, plasma is excited by microwave plasma. Since the plasma used for processing has a relatively low electron temperature, charging damage and other damage to the GaN-containing nitride layer, which serves as a base layer, can be significantly reduced. At least one film selected from the group consisting of the $SiO_2$ film formed by using the microwave plasma and the $Al_2O_3$ film formed by using the microwave plasma is used as at least a part of the gate insulating film, thereby providing the semiconductor device with excellent properties.

The nitride layer is preferably composed of a GaN layer and an AlGaN layer.

Advantageous Effects of Invention

According to the method for fabricating the semiconductor device, when the gate insulating film is formed on the GaN layer, plasma is excited by microwave plasma. Since the plasma used for processing has a relatively low electron temperature, charging damage and other damage to the GaN-containing nitride layer, which serves as a base layer, can be significantly reduced. In addition, at least one film selected from the group consisting of the $SiO_2$ film formed by using the microwave plasma and the $Al_2O_3$ film formed by using the microwave plasma is used as at least a part of the gate insulating film, thereby improving the properties of the gate insulating film. Therefore, semiconductor devices with excellent properties can be fabricated.

According to the semiconductor device, when the gate insulating film is formed on the GaN layer, plasma is excited by microwave plasma. Since the plasma used for processing has a relatively low electron temperature, charging damage and other damage to the GaN-containing nitride layer, which serves as a base layer, can be significantly reduced. In addition, at least one film selected from the group consisting of the $SiO_2$ film formed by using the microwave plasma and the $Al_2O_3$ film formed by using the microwave plasma is used as at least a part of the gate insulating film, thereby providing the semiconductor device with excellent properties.

DESCRIPTION OF EMBODIMENTS

Embodiments of the present invention will be described below with reference to the drawings. First, the structure and operation of a plasma processing apparatus used in a method for fabricating a semiconductor device according to an embodiment of the invention will be described.

Figure 1:
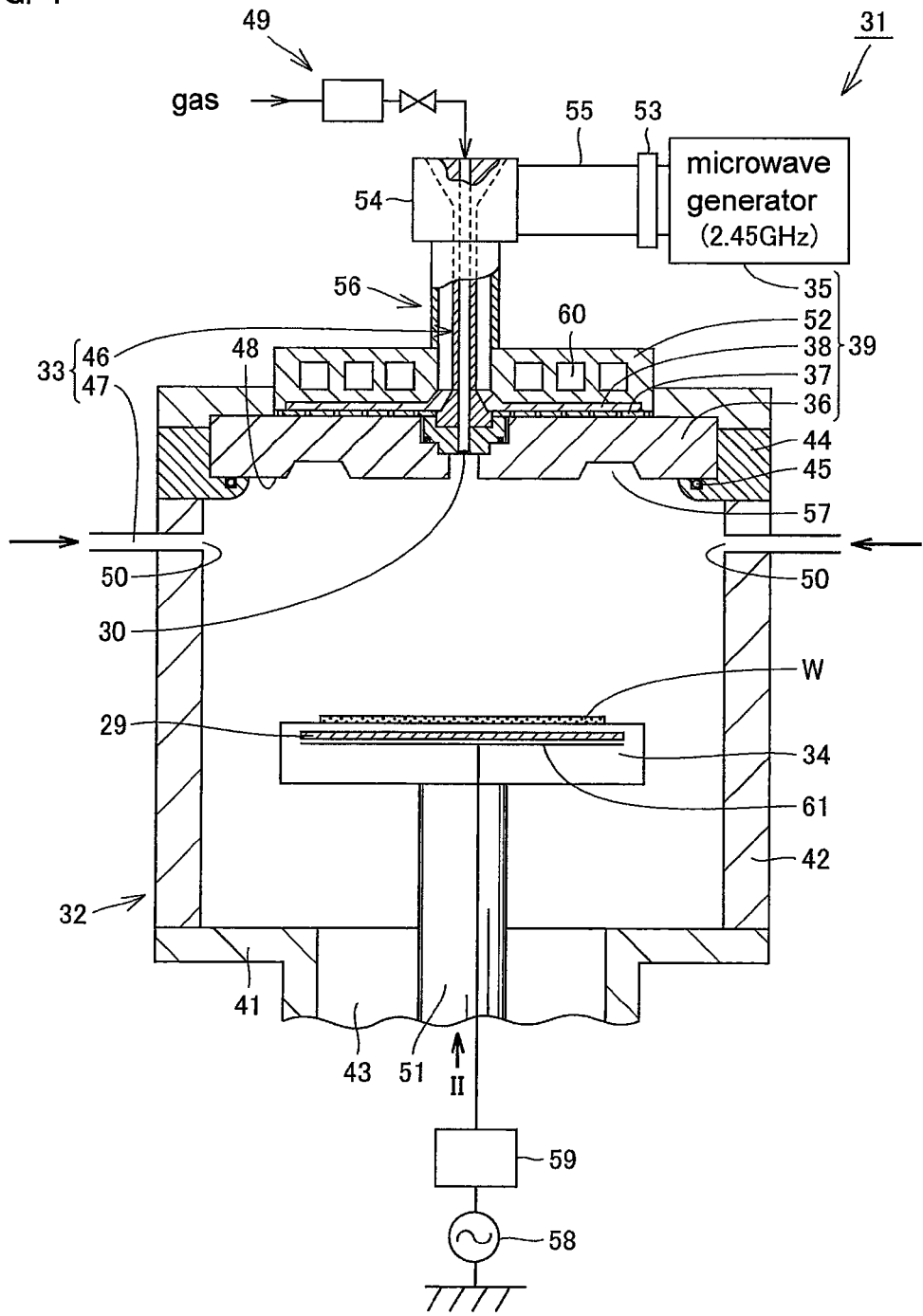
FIG. 1 is a schematic cross sectional view showing a relevant part of a plasma processing apparatus used in a method for fabricating a semiconductor device according to an embodiment of the present invention.
Figure 2:
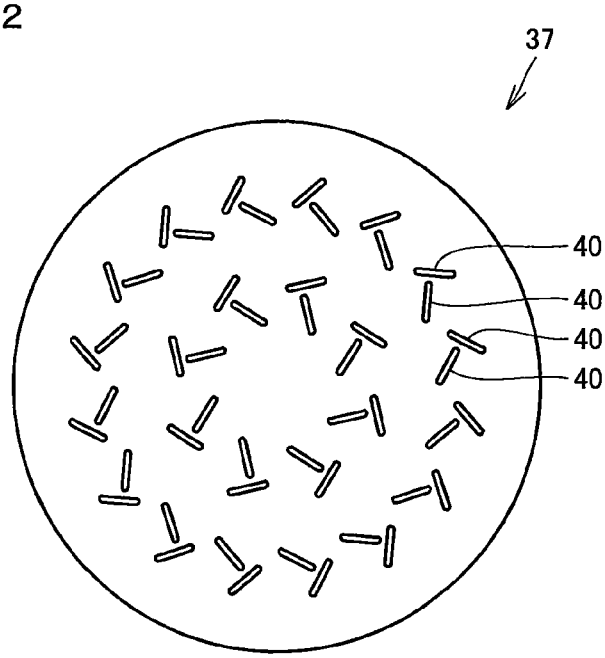
FIG. 2 shows a slot antenna plate in the plasma processing apparatus of FIG. 1, as viewed in a through-thickness direction.

FIG. 1 is a schematic cross sectional view showing a relevant part of the plasma processing apparatus used in the method for fabricating a GaN-based semiconductor device according to the embodiment of the present invention. FIG. 2 shows a slot antenna plate in the plasma processing apparatus of FIG. 1, as viewed from the bottom or in the direction of arrow II in FIG. 1. In order to provide a clear understanding of the apparatus of FIG. 1, some components of the apparatus are not hatched.

With reference to FIGS. 1 and 2, the plasma processing apparatus 31 includes a chamber 32 in which a substrate W to be processed undergoes plasma processing, a gas supplying section 33 that feeds plasma excitation gas, material gas used for plasma CVD processes, deposition gas used to perform an atomic layer deposition (ALD) method, which will be described later, and some other types of gas into the chamber 32, a disc-like holding stage 34 on which the substrate W is held, a plasma generation mechanism 39 that generates plasma with use of microwaves in the chamber 32, and a control unit (not shown) that controls the operation of the entire plasma processing apparatus 31. The control unit controls the operation of the entire plasma processing apparatus 31, including the gas flow rate of the gas supplying section 33 and pressure inside the chamber 32.

The chamber 32 has a bottom 41 positioned below the holding stage 34 and a sidewall 42 upwardly extending from the rim of the bottom 41. The sidewall 42 is roughly cylindrical. The chamber 32 has an exhaust hole 43 that penetrates a part of the bottom 41 to discharge gas. The chamber 32 has an opening in the top and is designed to be hermetically sealed by a cover 44 arranged on the top of the chamber 32, a dielectric window 36, which will be described later, and an O ring 45 that is a sealing member interposed between the dielectric window 36 and the cover 44.

The gas supplying section 33 includes a first gas supplying section 46 that blows gas toward the center of the substrate W to be processed and a second gas supplying section 47 that blows gas from the surroundings of the substrate W. The first gas supplying section 46 has a gas supply hole 30 that introduces gas and is positioned at the radially center of the dielectric window 36 and at an inwardly recessed part relative to the lower surface 48, which is an opposed surface to the holding stage 34, of the dielectric window 36. The first gas supplying section 46 supplies inert gas used to excite plasma, material gas, deposition gas and so on at a flow rate adjusted by a gas supply system 49 that is connected to the first gas supplying section 46. The second gas supplying section 47 is composed of a plurality of gas supply holes 50 formed in an upper part of the sidewall 42 to introduce plasma excitation gas, material gas, deposition gas and so on into the chamber 32. The gas supply holes 50 are spaced uniformly along the circumferential direction. The same kind of plasma excitation inert gas, material gas, deposition gas or the like is supplied from the same gas resource to the first and second gas supplying sections 46 and 47. Alternatively, according to the requirements and control conditions, the first gas supplying section 46 and second gas supplying section 47 can supply different types of gas at adjusted flow rates.

An RF generator 58 for supplying RF (radio frequency) bias is electrically connected to an electrode 61 in the holding stage 34 via a matching unit 59. This RF generator 58 can output, for example, a high frequency of 13.56 MHz at a predetermined amount of electric power (bias power). The matching unit 59 accommodates a matching box that matches the impedance of the RF generator 58 and the impedance of loads, mainly including the electrode 61, plasma, and chamber 32. The matching box contains a blocking capacitor that generates self-bias.

The holding stage 34 can hold the substrate W to be processed thereon with an electrostatic chuck (not shown). In addition, the holding stage 34 includes a heater (not shown) or the like to apply heat and a temperature regulating mechanism 29 that can set the holding stage 34 at a desired temperature. An insulative cylindrical support section 51 extends upwardly from below the bottom 41 in a vertical direction to support the holding stage 34. The aforementioned exhaust hole 43 is formed so as to penetrate a part of the bottom 41 of the chamber 32 along the outer circumference of the cylindrical support section 51. The lower part of the ring-like exhaust hole 43 is connected to an exhaust system (not shown) via an exhaust pipe (not shown). The exhaust system includes a vacuum pump such as a turbo-molecular pump. The pressure inside the chamber 32 can be reduced to a predetermined pressure by the exhaust system.

The plasma generation mechanism 39 is provided at an upper part of and outside the chamber 32 and includes a microwave generator 35 that generates microwaves to excite plasma, a dielectric window 36 that is opposed to the holding stage 34 and introduces the microwaves generated by the microwave generator 35 into the chamber 32, a slot antenna plate 37 that has a plurality of slots 40 (see FIG. 2) formed therein, disposed on the upper side of the dielectric window 36 and radiates the microwaves to the dielectric window 36, and a dielectric member 38 that is disposed on the upper side of the slot antenna plate 37 and radially propagates the microwaves introduced through a coaxial waveguide 56 which will be described later.

The microwave generator 35 with the matching mechanism 53 is connected to an upper part of the coaxial waveguide 56 for introducing microwaves via a waveguide 55 and a mode transducer 54. For example, a microwave propagating in TE mode, which is generated by the microwave generator 35, passes through the waveguide 55, is transduced into a microwave propagating in TEM mode by the mode transducer 54, and propagates through the coaxial waveguide 56. A selected frequency of the microwave generated by the microwave generator 35 is, for example, 2.45 GHz.

The dielectric window 36 is roughly in the shape of a disc that is made of a dielectric material. In a part of the lower surface 48 of the dielectric window 36 formed is a ring-like recess 57 that tapers down to facilitate generation of a standing wave of the introduced microwaves. With this recess 57, plasma can be efficiently generated by the microwaves under the dielectric window 36. Specific materials of the dielectric window 36 are quartz, alumina and so on.

The slot antenna plate 37 is in the shape of a thin disc. The plurality of long slots 40 are arranged, as shown in FIG. 2, in pairs, the slots 40 in each pair being orthogonal to each other as if they form the shape of a letter T. The pairs of the slots 40 are arranged in the circumferential direction at predetermined spacings. The pairs of the slots 40 are also arranged in the radial direction at predetermined spacings.

The microwave generated by the microwave generator 35 passes through the coaxial waveguide 56 and propagates to the dielectric member 38. The microwave spreads out radially in the dielectric member 38, which is interposed between a cooling jacket 52 and the slot antenna plate 37, and is radiated from the slots 40 formed in the slot antenna plate 37 to the dielectric window 36. The cooling jacket 52 includes a circulation path 60 therein through which a coolant circulates in order to adjust the temperature of the dielectric member 38 and other components. The microwave having passed through the dielectric window 36 generates an electric field immediately under the dielectric window 36 to generate plasma inside the chamber 32. In short, the microwave plasma to be used for processing in the plasma processing apparatus 31 is generated in the chamber 32 with the microwave radiated from the radial line slot antenna (RLSA) including the above-described cooling jacket 52, slot antenna plate 37, and dielectric member 38. Note that in the following description, the plasma generated in the above-described manner is occasionally referred to as RLSA plasma.

Figure 3:
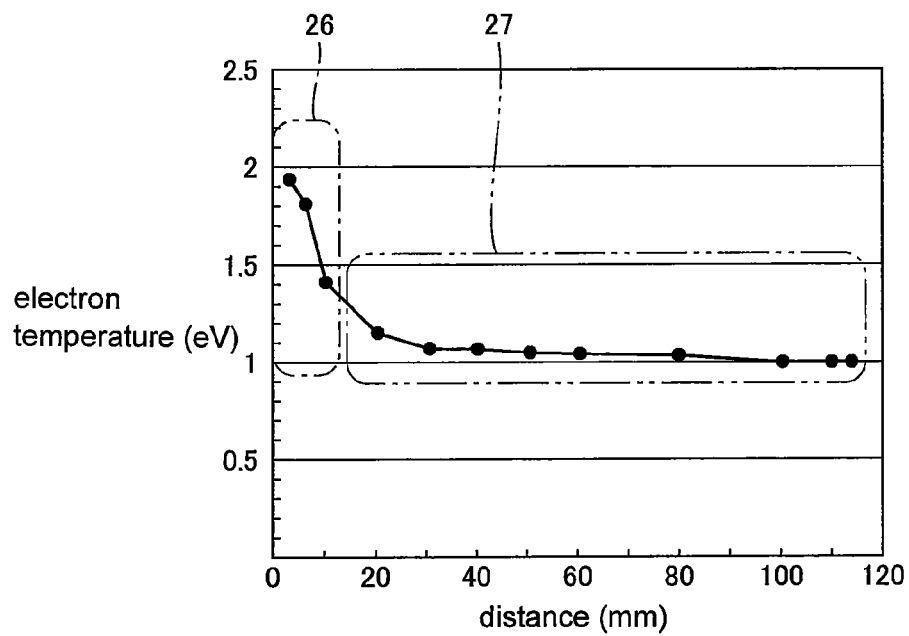
FIG. 3 is a graph showing the relationship between distance from a lower surface of a dielectric window and electron temperature of plasma.
Figure 4:
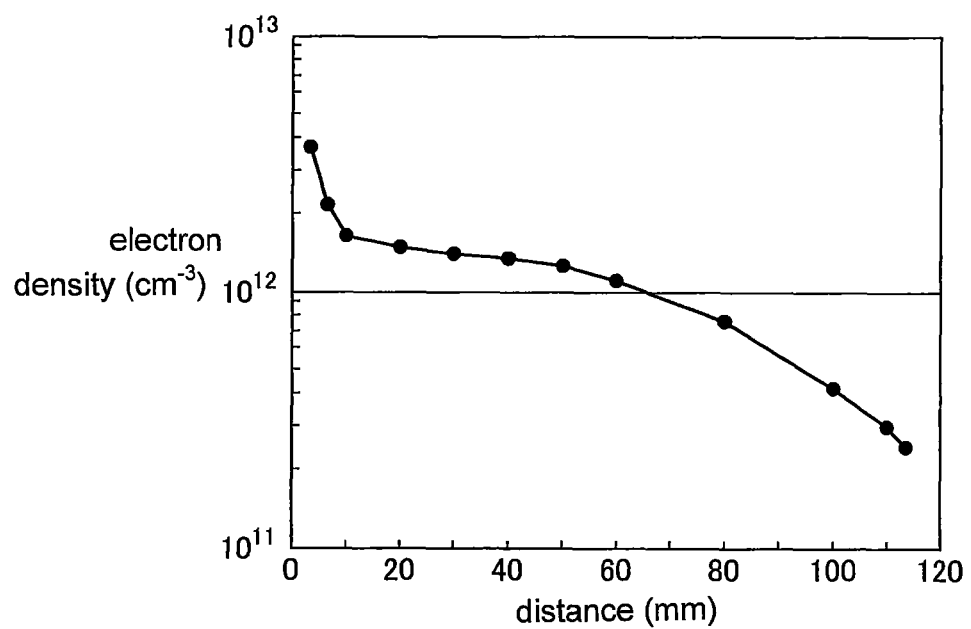
FIG. 4 is a graph showing the relationship between distance from a lower surface of a dielectric window and electron density of plasma.

FIG. 3 is a graph showing the relationship between distance from the lower surface 48 of the dielectric window 36 in the chamber 32 and electron temperature of plasma when the plasma is generated in the plasma processing apparatus 31. FIG. 4 is a graph showing the relationship between distance from the lower surface 48 of the dielectric window 36 in the chamber 32 and electron density of plasma when the plasma is generated in the plasma processing apparatus 31.

Referring to FIGS. 3 and 4, an area immediately under the dielectric window 36, more specifically an area 26 up to approximately 10 mm from the dielectric window 36, circled by a dot-and-dash line in FIG. 3, is so-called a plasma generation area. In this area 26, the electron temperature is high and the electron density is greater than $1\times10^{12}$ cm$^{-3}$. On the other hand, an area 27 over 10 mm from the lower surface 48, circled by a dashed double-dotted line, is referred to as a plasma diffusion area. In this area 27, the electron temperature is approximately 1.0 to 1.3 eV or lower than at least 1.5 eV, and the electron density is approximately $1\times10^{12}$ cm$^{-3}$ or higher than at least $1\times10^{11}$ cm$^{-3}$. The plasma processing performed on the substrate W, which will be described later, is conducted, for example, in the plasma diffusion area. It is preferable to perform the plasma processing in the vicinity of the surface of the substrate W by using the microwave plasma with an electron temperature lower than 1.5 eV and an electron density higher than $1\times10^{11}$ cm$^{-3}$.

The plasma processing apparatus 31 described above can generate RLSA plasma with a high electron density and a low electron temperature in the chamber 32 under a high pressure condition, for example, at a pressure of 50 mTorr or higher. In other words, with the RLSA plasma generated at a high pressure in the chamber 32, the plasma processing can be performed at a relatively low electron temperature and at a relatively high electron density.

The plasma processing apparatus 31 having the above-described structure is applicable to a plasma-enhanced ALD apparatus, a plasma-enhanced CVD apparatus, and a plasma etching apparatus. For example, the plasma processing apparatus 31 can etch the substrate W with etching gas and plasma excitation gas supplied from the gas supplying section under preferable predetermined etching conditions.

Figure 5:
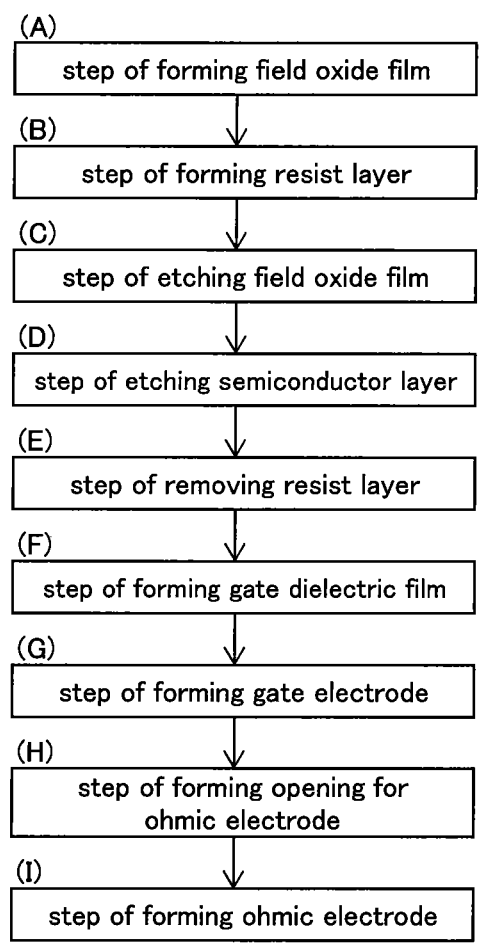
FIG. 5 is a flowchart showing representative fabrication steps of the method for fabricating the semiconductor device according to the embodiment of the invention.

Next, a method for fabricating a GaN-based semiconductor device with the use of the aforementioned plasma processing apparatus 31 will be described. FIG. 5 is a flowchart showing representative steps of the method for fabricating the semiconductor device according to an embodiment of the present invention. FIGS. 6, 7, 8, 9, 10, 11, 12, 13 and 14 are schematic cross sectional views showing a part of a semiconductor device material or a semiconductor device in the representative steps of the method for fabricating the semiconductor device according to the embodiment of the invention. In order to provide a clear understanding of the fabrication method, some components in FIGS. 6 to 14 are not hatched.

Figure 6:
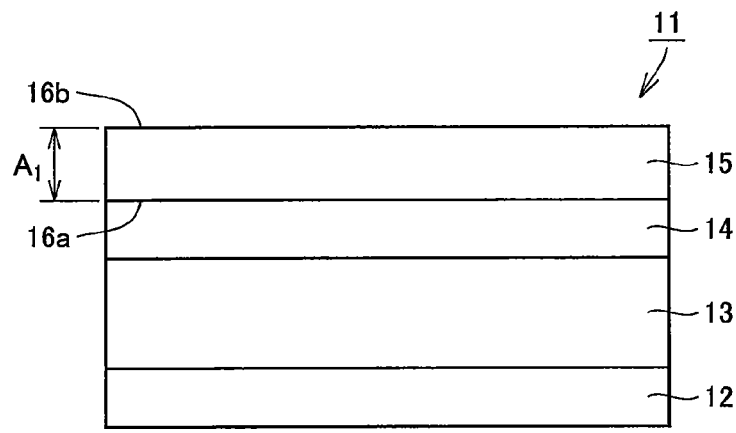
FIG. 6 is a schematic cross sectional view at the time when a field oxide film has been formed through the method for fabricating the semiconductor device according to the embodiment of the invention.

First, referring to FIGS. 5 and 6, a GaN layer 13 and an AlGaN layer 14 are successively formed on a substrate 12, which is a base made of Si (silicon), sapphire or the like, to prepare a semiconductor device material 11. The GaN layer 13 and AlGaN layer 14 in this description form a heterojunction. The semiconductor device including the semiconductor device material 11 is also referred to as AlGaN/GaN hybrid MOS-HFET (Metal Oxide Semiconductor-Heterojunction Field Effect Transistor). A step of joining the GaN layer 13 and AlGaN layer 14 to form a semiconductor layer is a step of forming a nitride layer containing GaN on a substrate.

Then, a silicon oxide film ($SiO_2$), which serves as a field oxide film 15, is formed on the prepared semiconductor device material 11, more specifically on the uppermost AlGaN layer 14 (FIG. 5 (A)). In this embodiment, a selected thickness of the field oxide film 15 is, for example, 300 nm. The film thickness described herein is concretely a thickness between the lower surface 16a and upper surface 16b of the field oxide film 15 in the thickness direction, more specifically is the distance $A_1$ indicated along the vertical direction in the drawing of FIG. 6. The field oxide film 15 is formed, for example, by CVD under normal pressures. The field oxide film 15 formed in the above manner is annealed at 800° C. for about 30 minutes to improve the film quality.

Figure 7:
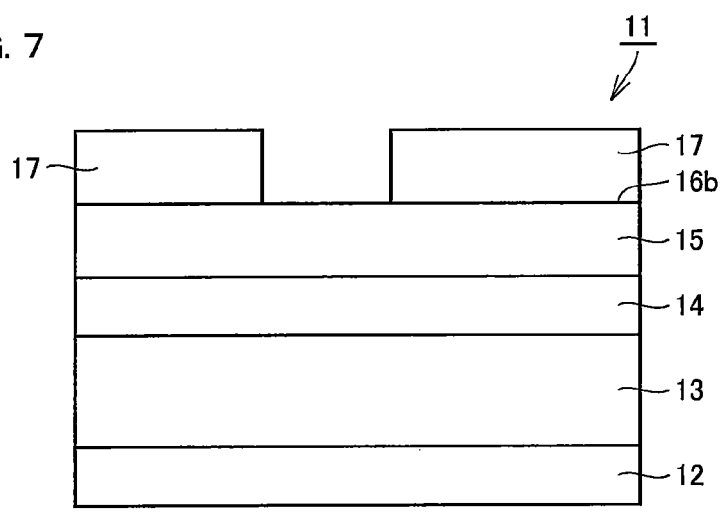
FIG. 7 is a schematic cross sectional view at the time when a resist layer has been formed through the method for fabricating the semiconductor device according to the embodiment of the invention.

Referring to FIG. 7, a resist layer 17 is formed over the field oxide film 15 and is patterned by photolithography (FIG. 5 (B)). A material of the resist layer 17 is, for example, OFPR 800LB.

Figure 8:
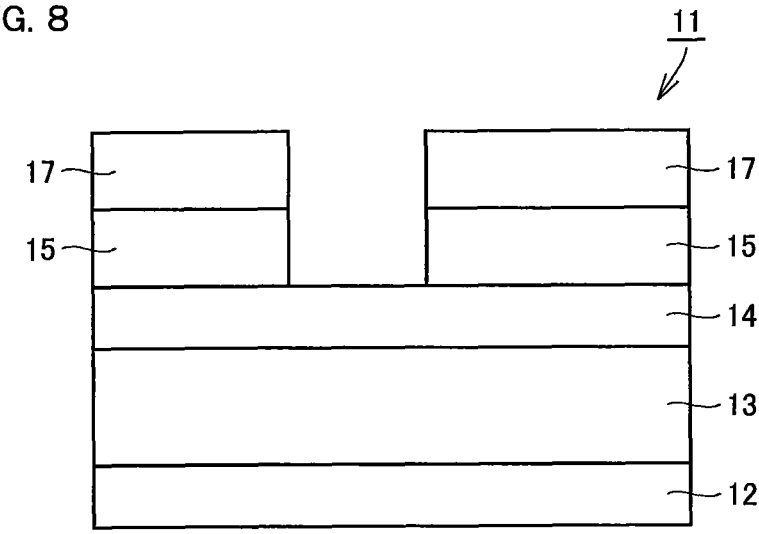
FIG. 8 is a schematic cross sectional view at the time when the field oxide film has been partially etched through the method for fabricating the semiconductor device according to the embodiment of the invention.

Referring to FIG. 8, the field oxide film 15 is etched using the formed resist layer 17 as a mask (FIG. 5 (C)). The etching performed on the field oxide film is so-called dry etching. An etching gas used herein is, for example, a mixture gas of $C_5F_8$ gas and $O_2$ gas.

Figure 9:
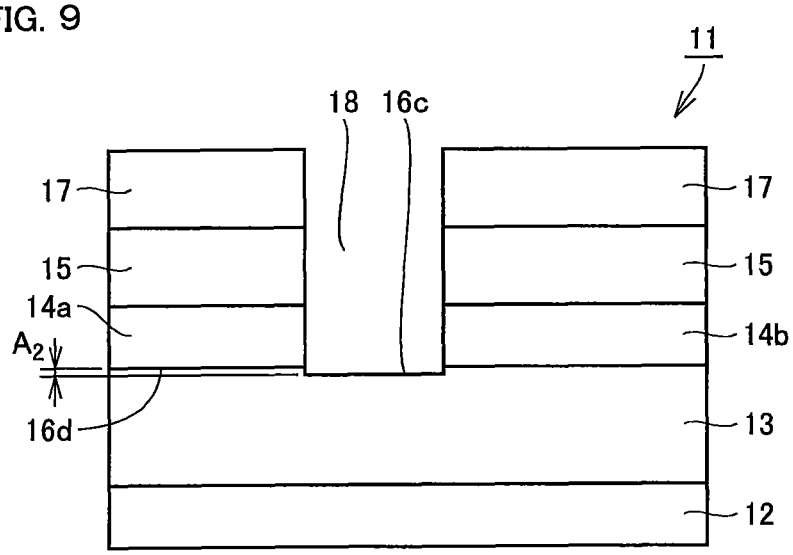
FIG. 9 is a schematic cross sectional view at the time when a semiconductor has been partially etched through the method for fabricating the semiconductor device according to the embodiment of the invention.

Referring to FIG. 9, the AlGaN layer 14 and GaN layer 13, which serves as a semiconductor layer, is subsequently etched using the formed resist layer 17 as a mask (FIG. 5 (D)). In this manner, an opening 18 to be used to form a gate electrode later is formed. The etching performed to form the opening is also dry etching. An etching gas used herein is, for example, HBr gas. The opening is formed so as to penetrate the AlGaN layer 14 in the thickness direction and so as to etch an upper part of the GaN layer 13, namely a part of the GaN layer 13 adjacent to the AlGaN layer 14 in the thickness direction. The GaN layer 13 is preferably etched about 10 nm in depth. In other words, in FIG. 9, the distance $A_2$ between a surface 16c of the GaN layer 13 exposed upward in the opening 18 and a lower surface 16d of the AlGaN layer 14 in the thickness direction is approximately 10 nm. After etched as described above, the semiconductor device material is subjected to ashing with oxygen ($O_2$) gas. Note that the etching process resultantly separates the AlGaN layer 14 into an AlGaN layer 14a on the left of the drawing to be a source region later and an AlGaN layer 14b on the right of the drawing to be a drain region later.

Figure 10:
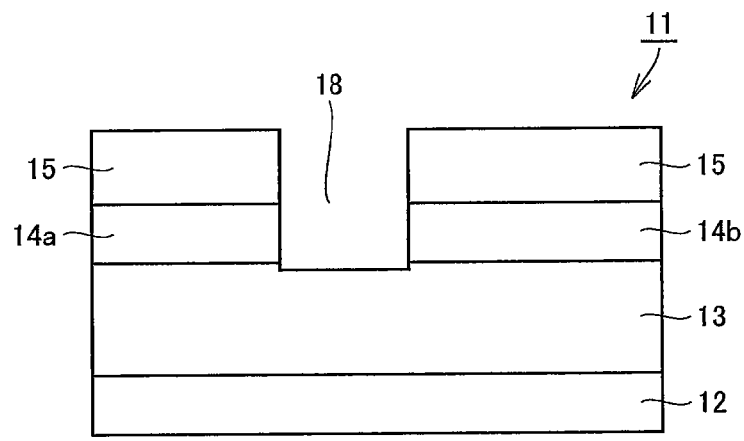
FIG. 10 is a schematic cross sectional view at the time when a resist layer has been removed through the method for fabricating the semiconductor device according to the embodiment of the invention.

Referring to FIG. 10, the formed resist layer 17 is removed (FIG. 5 (E)). Removal of the resist layer 17 is made, for example, by cleaning the resist layer 17, which is made of the aforementioned materials, with SPM (Sulfuric acid Hydrogen Peroxide Mixture), or by other removal techniques.

Figure 11:
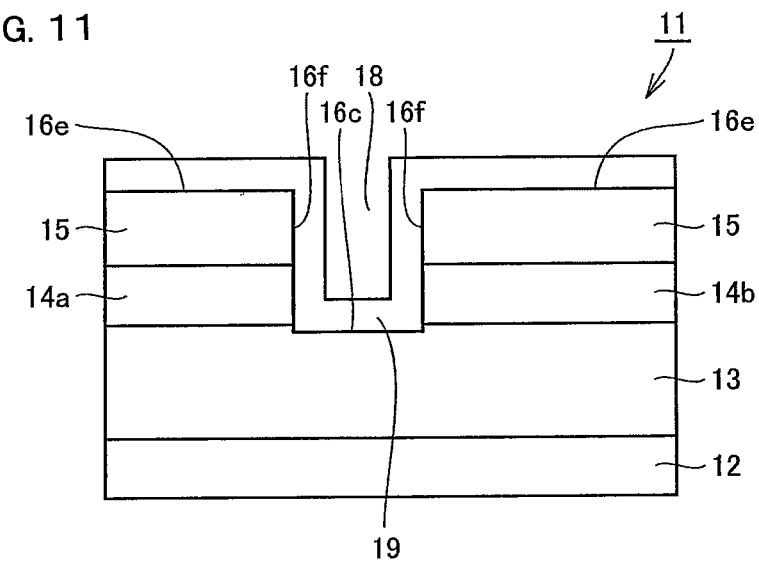
FIG. 11 is a schematic cross sectional view at the time when a gate insulating film has been formed through the method for fabricating the semiconductor device according to the embodiment of the invention.

Next, as shown in FIG. 11, a gate insulating film 19 is formed so as to cover an exposed surface 16e on the upper side of the field oxide film 15 and surfaces of the opening 18, the surfaces of the opening 18 including the surface 16c of the GaN layer 13 exposed upwardly in the opening 18 and a surface 16f of the sidewall of the opening 18 (FIG. 5 (F)). It may be preferable to clean the exposed surfaces 16c, 16e, and 16f before formation of the gate insulating film 19.

The gate insulating film 19 is formed by plasma-enhanced CVD using microwave plasma in the above-described plasma processing apparatus 31. A specific procedure will be described below.

Referring again to FIGS. 1 and 2, first, a semiconductor device material 11, which is a substrate W to be processed, is held by the action of an electrostatic chuck on the holding stage 34 placed in the chamber 32. Second, the gas supplying section 33 introduces inert gas, such as He gas, Ar gas, Xe gas, and Kr gas, serving as plasma excitation gas with the application of a predetermined amount of bias power. At this point, the pressure in the chamber 32 is controlled to be appropriate for plasma processing. Simultaneously, the temperature regulating mechanism 29 disposed in the holding stage 34 heats up the substrate W held on the holding stage 34 to 400° C. In this state, microwave plasma is generated in the chamber 32. The generated microwave plasma makes an area including the holding stage 34 into a plasma diffusion area.

Then, a material gas is supplied to perform plasma-enhanced CVD. The material gas is supplied through a gas supplying section 33. In this case, the material gas is mixed with plasma excitation inert gas and supplied. In this manner, the plasma-enhanced CVD using microwave plasma is performed.

The gate insulating film 19 formed herein is composed of a SiO$_2$ film. Specifically, the gate insulating film 19 is formed by supplying a material gas containing silicon atoms and oxygen atoms.

Figure 12:
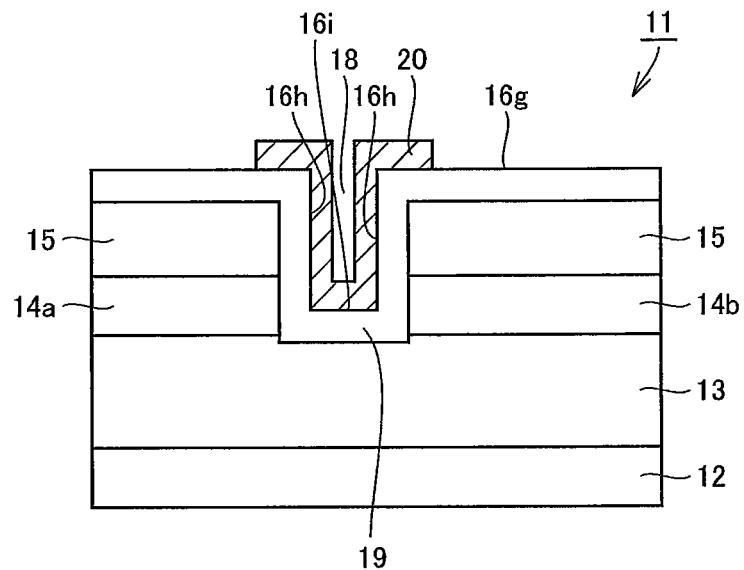
FIG. 12 is a schematic cross sectional view at the time when a gate electrode has been formed through the method for fabricating the semiconductor device according to the embodiment of the invention.

Subsequently, as shown in FIG. 12, a gate electrode 20 is formed in the opening 18 so as to cover the gate insulating film 19 (FIG. 5 (G)). A material of the gate electrode 20 is, for example, TaN (tantalum nitride). The gate electrode 20 is formed as follows: first, a layer of the TaN is formed by a facing target sputtering method so as to cover upwardly exposed surfaces, more specifically, a surface 16g on the upper side of the gate insulating film, a surface 16h on the sidewall of the opening 18, and a surface 16i on the bottom of the opening 18. After a resist layer (not shown) is subsequently formed over the upper layer, the resist layer is patterned by photolithography. Then, the TaN layer is wet-etched with an etchant, using the resist layer as a mask. In this manner, the TaN layer remains at a position corresponding to the opening 18, thereby forming a gate electrode 20. By the way, the etchant used herein is, for example, a mixed solution of HF (hydrofluoric acid), HNO$_3$ (nitric acid) and CH$_3$COOH (acetic acid) with a mixing ratio of HF:HNO$_3$:CH$_3$COOH=1:1:40.

Figure 13:
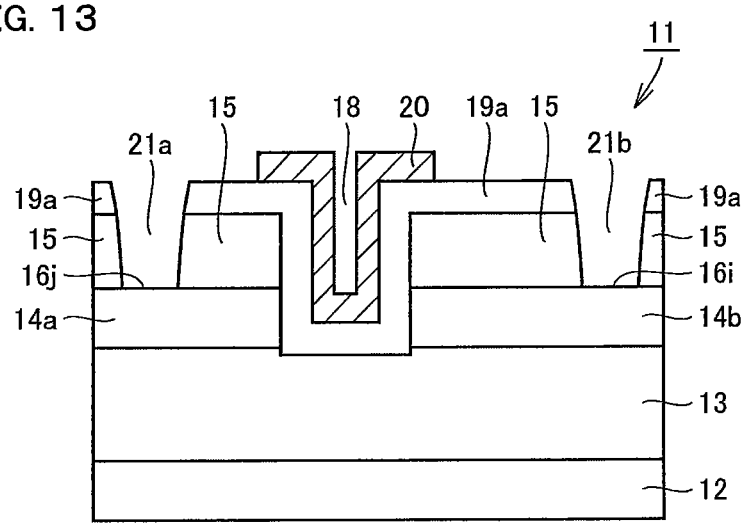
FIG. 13 is a schematic cross sectional view at the time when an opening for an ohmic electrode has been formed through the method for fabricating the semiconductor device according to the embodiment of the invention.

Next, as shown in FIG. 13, openings 21a, 21b are formed that are used to form ohmic electrodes which will be described later (FIG. 5 (H)). The openings 21a, 21b are formed by wet etching with LAL800. During the etching, predetermined parts of the gate insulating film 19a formed on the field oxide film 15 and the field oxide film 15 are etched. The gate insulating film 19a and the field oxide film 15 are etched until surfaces 16i, 16j on the upper side of the AlGaN layer 14 are exposed, thereby forming the openings 21a, 21b.

Figure 14:
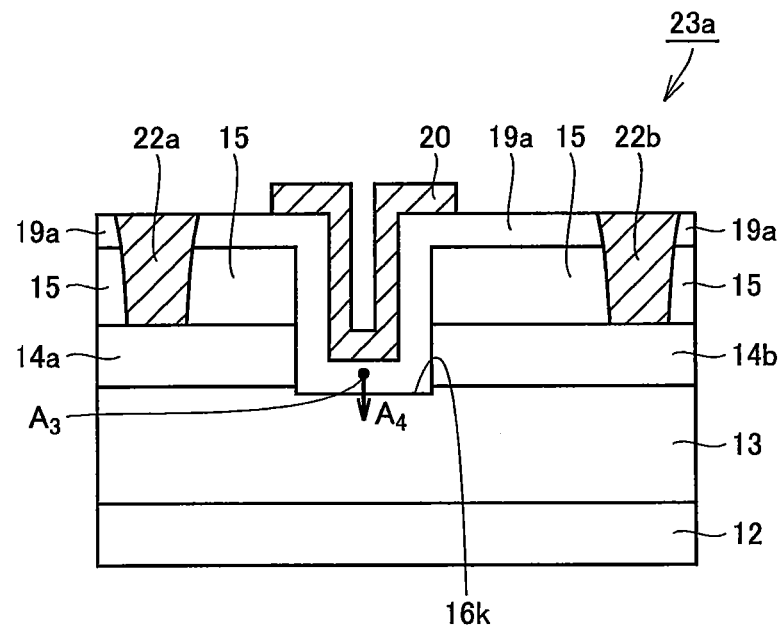
FIG. 14 is a schematic cross sectional view at the time when the ohmic electrode is formed in the method for fabricating the semiconductor device according to the embodiment of the invention.

Next, as shown in FIG. 14, ohmic electrodes 22a, 22b are formed in the prepared openings 21a, 21b (FIG. 5 (I)). The ohmic electrodes 22a, 22b are formed by filling the prepared openings 21a, 21b with a conductive material. Specifically, as with the case of the formation of the gate electrode 20, a TaN layer is firstly formed by a facing target sputtering method. Then, an Al (aluminum) layer of approximately 300 nm is formed by an evaporation method. Subsequently, photolithographic patterning and then wet etching are performed. The etchant used to etch Al is, for example, a mixed solution of H$_2$PO$_3$ (phosphoric acid), HNO$_3$ (nitric acid), CH$_3$COOH (acetic acid) and H$_2$O (water) with a mixing ratio of H$_2$PO$_3$:HNO$_3$:CH$_3$COOH:H$_2$O=16:1:2:1. The etchant used to etch TaN is, for example, the same etchant used to form the gate electrode, that is, a mixed solution of HF (hydrofluoric acid), HNO$_3$ (nitric acid) and CH$_3$COOH (acetic acid) with a mixing ratio of HF:HNO$_3$:CH$_3$COOH=1:1:40.

In this manner, the GaN-based semiconductor device 23a according to the embodiment of the invention is fabricated. Of the ohmic electrodes 22a, 22b formed on the right and left of the gate electrode 20 in the drawing, the ohmic electrode 22a that is provided on the left of the gate electrode 20 in the drawing with a relatively short space therebetween in the lateral direction functions as a source electrode and the AlGaN layer 14a under the source electrode functions as a source region. On the other hand, the ohmic electrode 22b that is provided on the right of the gate electrode 20 in the drawing with a relatively long space therebetween in the lateral direction functions as a drain electrode and the AlGaN layer 14b under the drain electrode functions as a drain region.

According to the method for fabricating the semiconductor device, when the gate insulating film of the GaN-based semiconductor device is formed on the GaN layer, plasma is excited by microwave plasma. Since the plasma used for processing has a relatively low electron temperature, electrical stress, such as charging damage, and physical damage caused by ion irradiation to the nitride layer containing GaN, which serves as a base layer, can be significantly reduced. In addition, the use of a SiO$_2$ film formed by using microwave plasma as the gate insulating film can improve the properties of the gate insulating film. Therefore, the method can provide semiconductor devices with excellent properties. Evaluation of the semiconductor devices with excellent properties will be described later.

Furthermore, the GaN-based semiconductor device according to the embodiment of the present invention is a semiconductor device including GaN that composes a semiconductor layer and includes a nitride layer including GaN that composes a semiconductor layer and a gate insulating film formed on the nitride layer. The gate insulating film in this embodiment includes a SiO$_2$ film formed by using microwave plasma.

Since the gate insulating film of the GaN-based semiconductor device is formed on the GaN layer with plasma excited by microwave plasma and is processed by using the microwave plasma with a relatively low electron temperature, charging damage and other damage to the nitride layer containing GaN, which serves as a base layer, can be significantly reduced. In addition, the SiO$_2$ film formed by using the microwave plasma is used as the gate insulating film. Therefore, the semiconductor device has excellent properties.

In the aforementioned embodiment, it is preferable to supply a material gas containing nitrogen oxides (NOx) during the CVD process using microwave plasma. Using such a gas can add a very small number of nitrogen (N) atoms into the SiO$_2$ film to be formed. The small number of nitrogen atoms can prevent Ga from diffusing from the GaN layer to the SiO$_2$ film. Therefore, further improvement of film quality can be achieved.

Although the SiO$_2$ film to be the gate insulating film is formed by a CVD process using microwave plasma in the aforementioned embodiment, the present invention is not limited thereto, and the SiO$_2$ film to be the gate insulating film can be formed by an ALD method using microwave plasma. In short, an ALD process using microwave plasma can be used to form the SiO$_2$ film.

Figure 15:
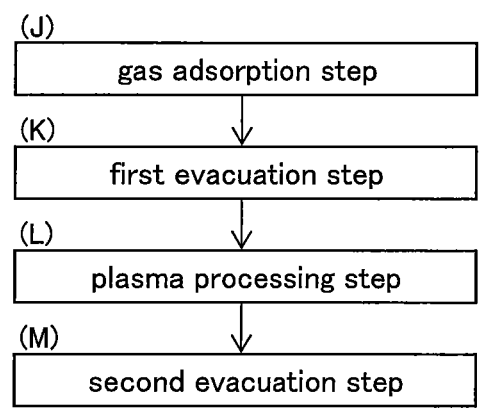
FIG. 15 is a flowchart showing representative steps of forming the gate insulating film through a method for fabricating the semiconductor device according to another embodiment of the invention.

FIG. 15 is a flowchart showing representative steps of forming the gate insulating film through a method for fabricating the semiconductor device according to another embodiment of the present invention. The flowchart of FIG. 15 corresponds to the step of forming the gate insulating film (F) in the flowchart of FIG. 5. The other steps in the method for fabricating the semiconductor device according to this embodiment of the invention are identical to the steps (A) to (E) and steps (G) to (I) in FIG. 5, and therefore the explanations thereof will not be reiterated.

Referring to FIG. 15, the gate insulating film is formed by an ALD process by using microwave plasma in the aforementioned plasma processing apparatus 31. The ALD process begins with application of deposition gas to a semiconductor device material 11, which will be a substrate W and has openings and so on (FIG. 15 (J)). The application of the deposition gas will be made from a gas supplying section 33.

After the deposition gas is adsorbed to deposit a few atomic layers, a first evacuation step of the deposition gas is carried out (FIG. 15 (K)). Upon the completion of the deposition gas evacuation, plasma excitation gas is introduced (FIG. 15 (L)). With the generated microwave plasma, the adsorbed atom layers are subjected to plasma processing. In this manner, a few atom layers of SiO$_2$ are deposited. Then, a second evacuation step of the plasma excitation gas is carried out (FIG. 15 (M)). The gas adsorption step, the first evacuation step, the plasma processing step and the second evacuation step shown in FIG. 15 (J) to FIG. 15 (M) form one cycle, and a few cycles are carried out to obtain a $SiO_2$ film having a desired thickness.

The obtained $SiO_2$ film, namely the $SiO_2$ film formed by ALD by using microwave plasma, can be denser than the $SiO_2$ film formed by the CVD method by using microwave plasma, thereby improving a property required to semiconductor devices, that is a leakage characteristic. Consequently, the ALD process using microwave plasma can further improve the film quality.

Preferable deposition gas used to form the $SiO_2$ film by the ALD process is an aminosilane-based ALD film-forming material which is a silicon dioxide film material containing N (nitrogen). Such deposition gas can add a trace amount of N into the $SiO_2$ film. The trace amount of N present in the film can prevent Ga in the GaN layer from diffusing into the $SiO_2$ film, i.e., the gate insulating film. An example of the deposition gas contains BTBAS (bis-tertiaryl-buthyl-amino-silane).

Although the $SiO_2$ film is formed as a gate insulating film in the aforementioned embodiment, the present invention is not limited thereto, and, for instance, an $Al_2O_3$ (alumina) film can be used instead of the $SiO_2$ film. In short, at least one film selected from the group consisting of the $SiO_2$ film and $Al_2O_3$ film may be formed in the step of forming the gate insulating film.

Consequently, the method for fabricating the semiconductor device according to the embodiment of the present invention is to fabricate a semiconductor device including GaN (gallium nitride) that composes a semiconductor layer and includes a step of forming a gate insulating film, in the step at least one film selected from the group consisting of a $SiO_2$ film and an $Al_2O_3$ film being formed on a nitride layer containing GaN by using microwave plasma and the formed film being used as the gate insulating film.

The semiconductor device according to the embodiment of the present invention is a semiconductor device including GaN that composes a semiconductor layer and includes a nitride layer including GaN that composes the semiconductor layer and a gate insulating film formed on the nitride layer. The gate insulating film includes at least one film selected from the group consisting of a $SiO_2$ film formed by using microwave plasma and an $Al_2O_3$ film formed by using microwave plasma.

A study has been conducted of what materials are preferable for the gate insulating film in the GaN-based semiconductor device and the study results will be shown below. Possible materials for the gate insulating film in the GaN-based semiconductor device are, in addition to the aforementioned $SiO_2$ and $Al_2O_3$, $SiN_x$ such as $Si_3N_4$, AlN, GaOx such as $Ga_2O_3$, $Gd_2O_3$, MgO, $Sc_2O_3$, $HfO_2$, $ZrO_2$ and some other compounds. As described above, the gate insulating film used in the GaN-based semiconductor device is required to have a large conduction band offset ($\Delta Ec$). The gate insulating film is also desired to have a high breakdown voltage. $Si_3N_4$, $Ga_2O_3$, $HfO_2$ and $ZrO_2$ are reported to have a band offset $\Delta Ec$ of 1.3 eV, 0.46 eV, 1.09 eV and 1.1 eV, respectively, which are relatively small. $Ga_2O_3$, $Gd_2O_3$, MgO and $Sc_2O_3$ are reported to have a breakdown voltage of 2.8 MV/cm, 0.1 or 3 MV/cm, 1.2 MV/cm and 0.7 MV/cm, respectively, which are relatively low. AlN in a crystalline state has a relatively high breakdown voltage, approximately less than 15 MV/cm, but AlN in an amorphous state has a relatively low breakdown voltage, approximately 1.4 MV/cm. Therefore, $SiO_2$ and $Al_2O_3$ are preferable as a material of the gate insulating film in the GaN-based semiconductor device. In the above described fabrication method, a film including $SiO_2$ is formed to use as a gate insulating film; however, a film including $Al_2O_3$ can be formed to use as the gate insulating film instead of the $SiO_2$.

Figure 16:
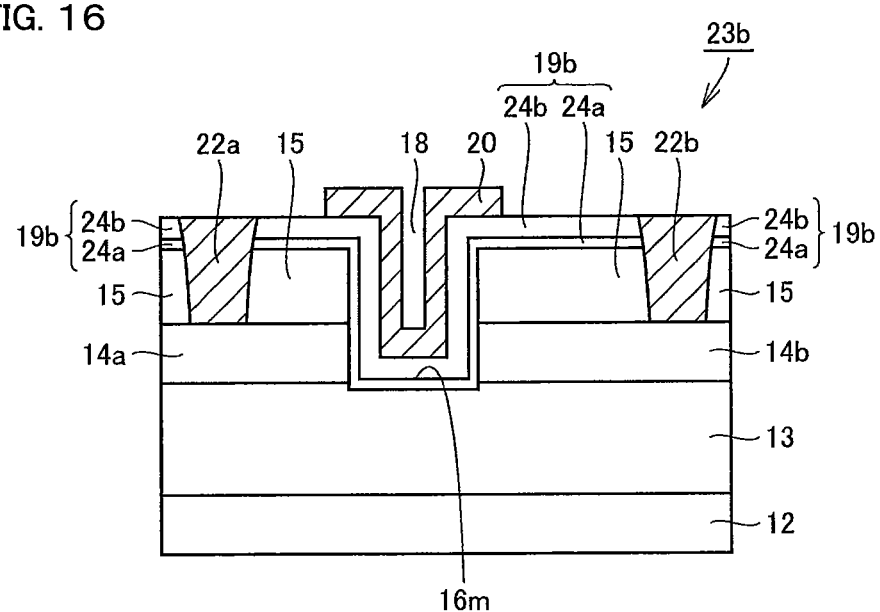
FIG. 16 is a schematic cross sectional view showing a part of a semiconductor device fabricated by a method for fabricating the semiconductor device according to yet another embodiment of the invention.

In addition, the gate insulating film can be a double-layer gate insulating film in which a $SiO_2$ film and an $Al_2O_3$ film are stacked. FIG. 16 is a schematic cross-sectional view of a GaN-based semiconductor device with a double-layer gate insulating film and corresponds to the cross-section of FIG. 14. In FIG. 16, like components are denoted by like numerals as of FIG. 14 and therefore the explanations thereof will not be reiterated.

Referring to FIG. 16, a semiconductor device 23b fabricated by a method for fabricating the semiconductor device according to yet another embodiment of the present invention includes a gate insulating film 19b from between a GaN layer 13, which composes a semiconductor layer, and a gate electrode 20 to between a field oxide film 15 and the gate electrode 20. The gate insulating film 19b is composed of an $Al_2O_3$ film 24a that is an oxide film adjacent to the GaN layer 13, which composes a semiconductor layer, and the AlGaN layers 14a, 14b and a $SiO_2$ film 24b that is an oxide film adjacent to the gate electrode 20, in the vicinity of the opening 18 as viewed vertically in the drawing. In short, the gate insulating film 19b is a double-layer film composed of the $Al_2O_3$ film 24a and $SiO_2$ film 24b.

The double-layer gate insulating film can utilize the advantages of the respective film properties, thereby satisfying the requirements for the gate insulating film, and by extension the semiconductor device. The gate insulating film is not limited to the double-layer and can have three layers or more according to the needs and requirements. In addition, the $Al_2O_3$ film and $SiO_2$ film can be replaced with each other in the vertical direction. In other words, the $Al_2O_3$ film can be formed after the $SiO_2$ film has been formed.

In the case of using the double-layer gate insulating film, the $Al_2O_3$ film may be formed by thermal ALD and the $SiO_2$ film may be formed by plasma-enhanced CVD. Thus, the method for fabricating the semiconductor device according to the embodiment of the invention includes a step of forming the gate insulating film by forming a $SiO_2$ film on a nitride layer containing GaN by using microwave plasma and using the formed film as a part of the gate insulating film. Specifically, the step of forming the gate insulating film is a step of forming the $Al_2O_3$ film by thermal ALD and forming the $SiO_2$ film by plasma-enhanced CVD. The method for fabricating the semiconductor device can include such a step. In this case where the gate insulating film includes an $Al_2O_3$ film formed by thermal ALD and a $SiO_2$ film formed by plasma-enhanced CVD by using microwave plasma, and the $SiO_2$ film formed by plasma-enhanced CVD functions as a part of the gate insulating film.

Specific process conditions when the $Al_2O_3$ film is formed as a part of the gate insulating film by the thermal ALD are shown as follows: temperature of the holding stage is 200 to 400° C.; pressure inside the chamber is 0.1 to 1 Torr; flow rate of oxygen is 5 to 30 slm; and flow rate of trimethylaluminium (TMA) gas is 50 to 1000 sccm. Under the conditions, gas adsorption is carried out. While oxygen is being supplied at the flow rate, the pressure of the chamber is increased to 0.5 to 2 Torr, and $O_3$ (ozone) gas, i.e., an oxidant, of 100 to 500 $g/Nm^3$ is introduced to form a film. These steps form a cycle that takes place for 5 to 120 seconds. This cycle of the thermal ALD is repeated until the $Al_2O_3$ film reaches a desired thickness.

Subsequently, a $SiO_2$ film is formed as described above by plasma-enhanced CVD by using microwave plasma on the $Al_2O_3$ film formed by the thermal ALD to obtain a gate insulating film including the $Al_2O_3$ film on the lower side and the $SiO_2$ film on the upper side and having a desired thickness.

This process can avoid using plasma to form the $Al_2O_3$ film. In addition, this process can reduce charging damage or the like to the GaN layer positioned on the lower side of the $Al_2O_3$ film during formation of the $SiO_2$ film by using microwave plasma.

The outermost surface of the $Al_2O_3$ film can be subjected to radical oxidation by using microwave plasma for a predetermined period of time between formation of the $Al_2O_3$ film and formation of the $SiO_2$ film, in other words, after the $Al_2O_3$ film is formed by thermal ALD and before the $SiO_2$ film is formed by plasma-enhanced CVD. In a specific exemplary process, an $Al_2O_3$ film formed by thermal ALD is placed in a plasma diffusion area created by using microwave plasma for a predetermined period of time, and then, material gas is introduced to form a $SiO_2$ film by plasma CVD process. This can further improve the film quality. Evaluation of the thus fabricated semiconductor devices will be described later.

In a case where the gate insulating film is designed to include either one of the films, i.e., where a single-layer gate insulating film is formed, the gate insulating film can be formed by both plasma-enhanced ALD and plasma-enhanced CVD processes.

Figure 17:
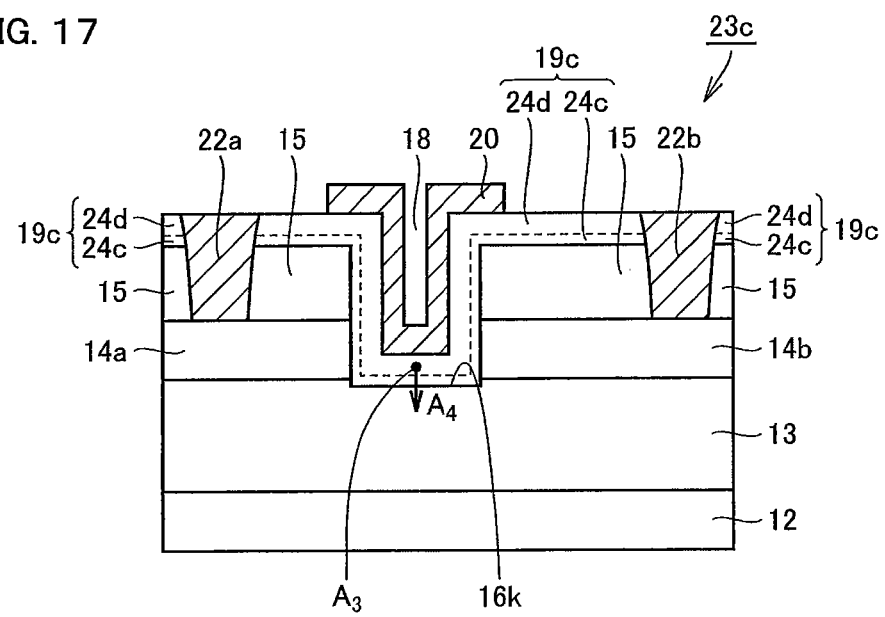
FIG. 17 is a schematic cross sectional view showing a part of a semiconductor device fabricated by a method for fabricating the semiconductor device according to yet another embodiment of the invention.

FIG. 17 is a schematic cross-sectional view of the GaN-based semiconductor device with the single-layer gate insulating film and corresponds to the cross sections of FIGS. 14 and 16. In FIG. 17, like components are denoted by like numerals as of FIG. 14 and therefore the explanations thereof will not be reiterated.

Referring to FIG. 17, a semiconductor device 23c fabricated by a method according to yet another embodiment of the invention includes a gate insulating film 19c from between a GaN layer 13, which composes a semiconductor layer, and a gate electrode 20 to between a field oxide film 15 and the gate electrode 20. The gate insulating film 19c includes a $SiO_2$ film 24c that is a first oxide film formed by plasma-enhanced ALD adjacent to the GaN layer 13, which composes a semiconductor layer, and AlGaN layers 14a, 14b and a $SiO_2$ film 24d that is a second oxide film formed by plasma-enhanced CVD adjacent to the gate electrode 20, in the vicinity of the opening 18 as viewed vertically in the drawing. In short, the gate insulating film 19c is a double-layer structure film including the $SiO_2$ film 24c formed by plasma-enhanced ALD and the $SiO_2$ film 24d formed by plasma-enhanced CVD. In FIG. 17, an approximate position of the interface between the $SiO_2$ film 24c and $SiO_2$ film 24d is indicated by a dotted line.

The semiconductor device designed as above has the following advantages. The $SiO_2$ film 24c formed by plasma-enhanced ALD can suppress Ga diffusion from the GaN layer 13, while the $SiO_2$ film 24d formed at a faster deposition rate by plasma-enhanced CVD can enhance the throughput.

Figure 18:
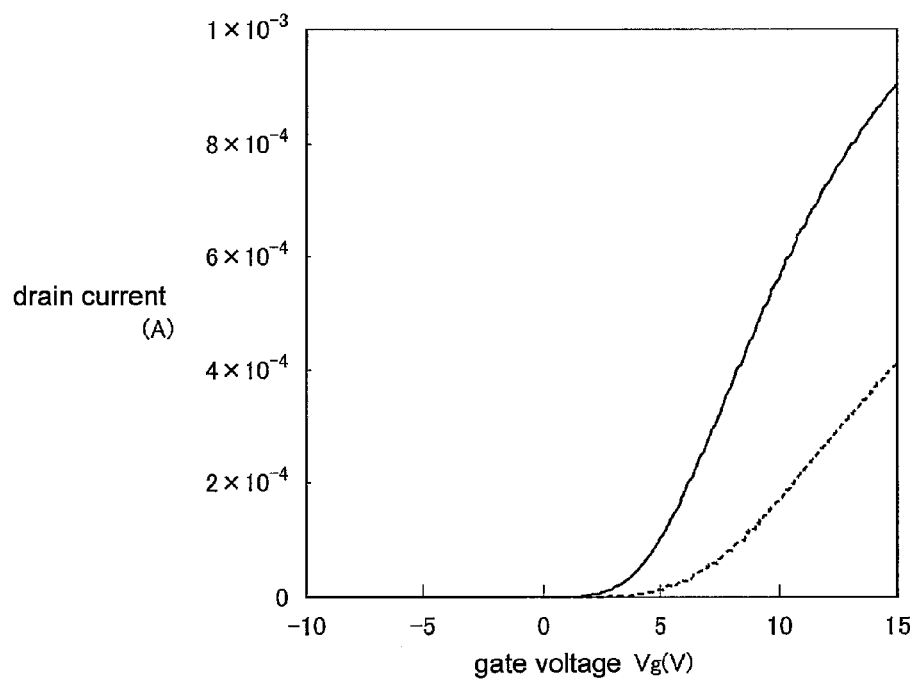
FIG. 18 is a graph showing the relationship between gate voltage and drain current.

The next description will be about evaluations on the properties of the semiconductor devices fabricated by the methods according to the invention. FIG. 18 is a graph showing the relationship between gate voltage and drain current. The dotted line in FIG. 18 represents a GaN-based semiconductor device with a gate insulating film formed by CVD using CCP (capacitively-coupled plasma), hereinafter abbreviated as CCP-PE (Plasma Enhanced) CVD. The solid line in FIG. 18 represents a GaN-based semiconductor device fabricated by the method according to one of the embodiments of the invention, hereinafter abbreviated as RLSA-PECVD. In FIG. 18, the vertical axis represents drain current (A), while the horizontal axis represents gate voltage (V). In measurement, the semiconductor devices have a channel length Lch of 4 µm and a channel width Wch of 0.84 mm and a voltage Vds of 0.1 V is applied between the drain and source of the semiconductor devices. The relationship between the gate voltage and drain current shown in FIG. 18 presents the current leakage characteristic. It is preferable that application of a small gate voltage induces a large drain current flow, and in the case of the graph in FIG. 18, it is preferable that the lines vertically rise when the gate voltage Vg is slightly higher than 0 V, this rise demonstrating the excellent driving cap ability.

Referring to FIG. 18, in the case of the semiconductor device formed by CCP-PECVD, application of approximately 5V gate voltage finally causes drain current to start flowing and the drain current then moderately increases with an increase of the gate voltage. On the contrary, in the case of the semiconductor device formed by RLSA-PECVD, application of approximately 3V gate voltage causes drain current to start flowing and the drain current then steeply increases with an increase of the gate voltage. The results in FIG. 18 demonstrate that the semiconductor device formed by RLSA-PECVD is superior to the semiconductor device formed by CCP-PECVD.

Figure 19:
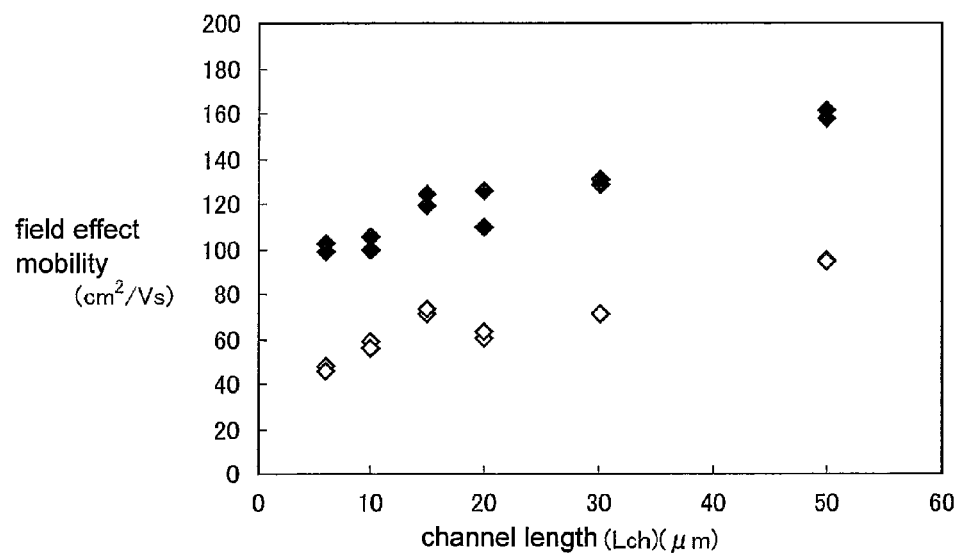
FIG. 19 is a graph showing the relationship between channel length and field effect mobility.

FIG. 19 is a graph showing the relationship between channel length (Lch) and field effect mobility. In FIG. 19, hollow diamonds represent the semiconductor device formed by CCP-PECVD, while black diamonds represent the semiconductor device formed by RLSA-PECVD. In FIG. 19, the vertical axis represents field effect mobility ($cm^2$/Vs), while the horizontal axis represents channel length (µm). In measurement, the voltage Vds applied between the drain and source of the measured semiconductor devices is 0.1 V. The relationship between the channel length and field effect mobility in FIG. 19 demonstrates that a semiconductor device with higher field effect mobility at predetermined channel lengths is superior.

FIG. 19 shows that the semiconductor device formed by RLSA-PECVD exhibits higher field effect mobility than that by CCP-PECVD at respective channel lengths, 10 nm, 20 nm or longer. The results in FIG. 19 also demonstrate that the semiconductor device formed by RLSA-PECVD is superior to the semiconductor device formed by CCP-PECVD.

Figure 20:
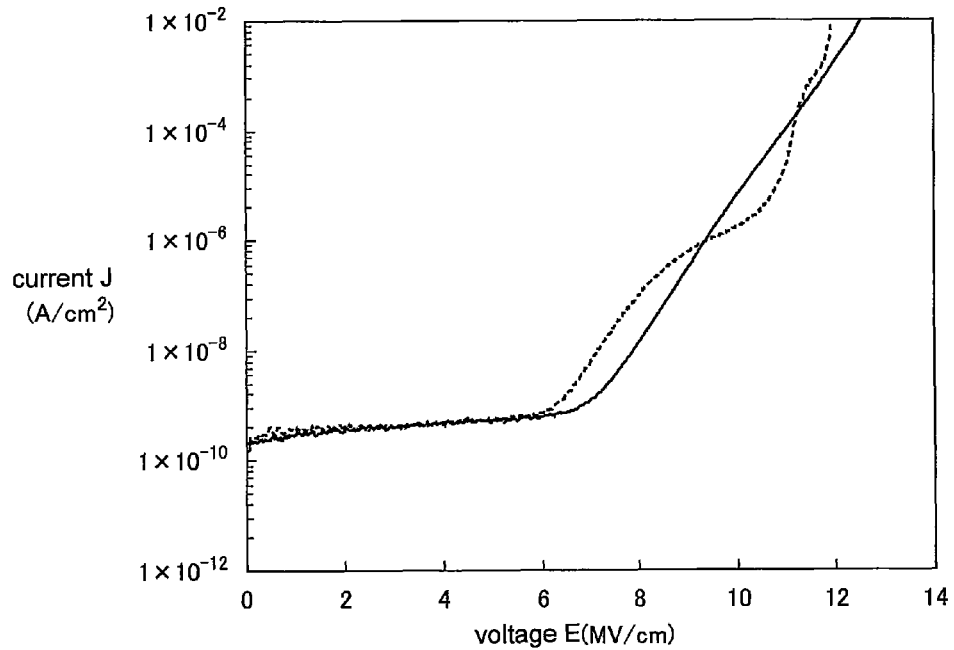
FIG. 20 is a graph showing I-V curves.

The graphs so far show that the PEALD process is more preferable than PECVD process to form the gate insulating film. FIG. 20 is a graph showing I-V curves representing so-called J-E characteristics. In FIG. 20, the vertical axis represents current J per unit area (A/$cm^2$), while the horizontal axis represents voltage (MV/cm). In measurement, the area to be measured is defined as $4.52 \times 10^4$ $cm^2$, and the thickness of the semiconductor device formed by PEALD is 15.9 nm and by PECVD is 63.8 nm. Regarding the J-E characteristics shown in FIG. 20, it is preferable that voltage and current establish a nearly direct proportional relationship and the proportional relationship is maintained even if a high voltage is applied, that is, electrical breakdown does not occur.

Referring to FIG. 20, in the case of the semiconductor device formed by PEALD indicated by a solid line in FIG. 20, the current value starts increasing at around a voltage of 6 MV/cm, the graph line rises, and the current value ascends with application of the voltage while maintaining the nearly direct proportional relationship. On the contrary, in the case of the semiconductor device formed by PECVD indicated by a dotted line in FIG. 20, the current value starts increasing at almost the same voltage of 6 MV/cm and the graph line rises, but the current value then ascends so as to draw a wavy line. In addition, a phenomenon that seems like electrical breakdown occurs at around a voltage of 12 MV/cm. The results in FIG. 20 demonstrate that the oxide film formed by PEALD is superior to the oxide film formed by PECVD.

Figure 21:
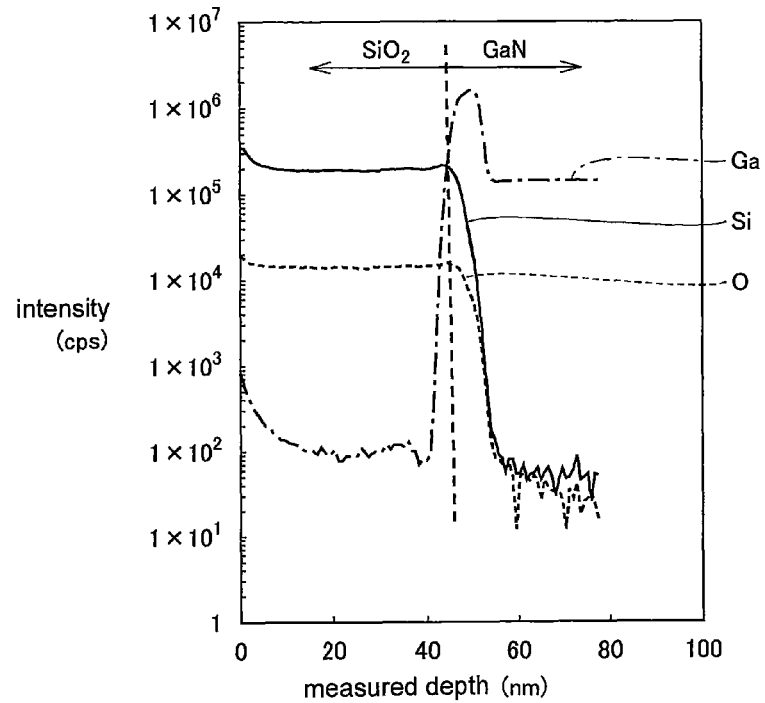
FIG. 21 is a graph showing measurement results of secondary-ion mass spectrometry on a gate insulating film including a $SiO_2$ film formed by PECVD and a $SiO_2$ film formed by an ALD method.
Figure 22:
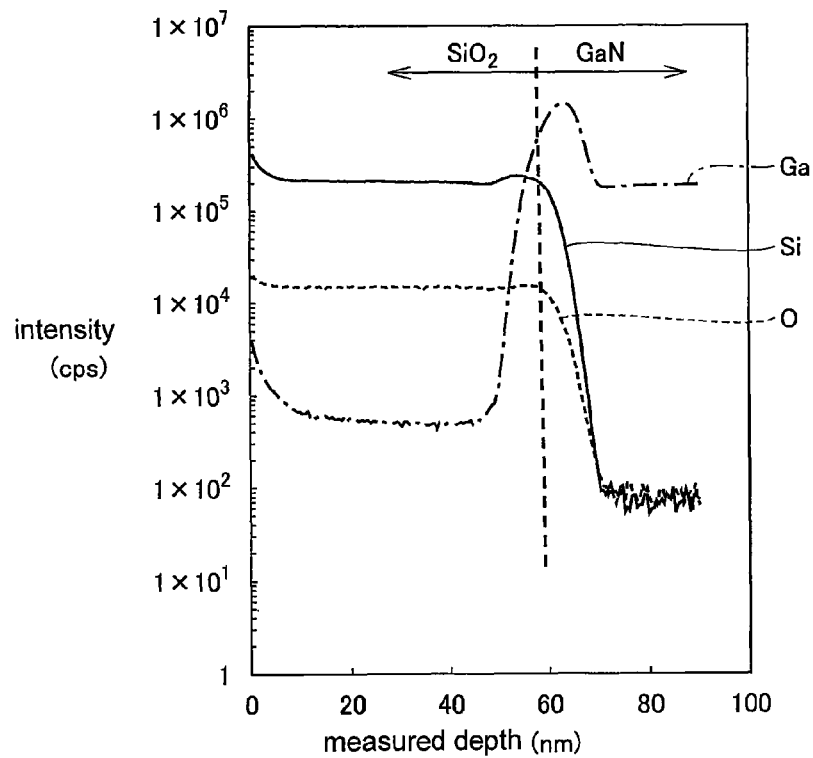
FIG. 22 is a graph showing measurement results of secondary-ion mass spectrometry on a gate insulating film including a $SiO_2$ film formed by only PECVD.

FIG. 21 is a graph showing the measurement results of secondary-ion mass spectrometry (SIMS) on a gate insulating film including a $SiO_2$ film formed by PECVD and a $SiO_2$ film formed by PEALD. FIG. 22 is a graph showing the measurement results of secondary-ion mass spectrometry on a gate insulating film including a $SiO_2$ film formed by PECVD alone. Both the gate insulating films shown in FIGS. 21 and 22 include a $SiO_2$ film with a thickness of 60 nm. In FIGS. 21 and 22, the vertical axis represents intensity (cps), while the horizontal axis represents measured depth (nm) from a set reference position. In FIGS. 21 and 22, the solid line represents Si (silicon), the dotted line represents O (oxygen), and the dot-and-dash line represents Ga (gallium).

In FIGS. 21 and 22, a left area with respect to a dotted line is an area where the formed gate insulating film, or a $SiO_2$ film, is disposed, while a right area with respect to the dotted line is an area where a GaN layer is disposed. Specifically, the position of 0 nm along the horizontal axis in FIG. 21 corresponds to the position $A_3$ in the gate oxide film in FIG. 17, the position of 0 nm along the horizontal axis in FIG. 22 corresponds to the position $A_3$ in the gate oxide film in FIG. 14, and the measured depth becomes greater in the direction of arrows $A_4$ from the positions $A_3$. The vertically-extending dotted line roughly represents the interface between the $SiO_2$ film and GaN layer and corresponds to the surface 16k in FIGS. 17 and 14.

Referring to FIG. 21, the gate insulating film with a 20-nm $SiO_2$ film formed by PEALD and a 40-nm $SiO_2$ film formed by PECVD has Ga intensity at a level of about $1 \times 10^2$ in the area where the $SiO_2$ is present. On the contrary, referring to FIG. 21, the gate insulating film with a 60-nm $SiO_2$ film formed by only PECVD has Ga intensity at a level of about $1 \times 10^3$ in the area where the $SiO_2$ is present. In comparison with the gate insulating film including the 20-nm $SiO_2$ formed by PEALD and the 40-nm $SiO_2$ formed by PECVD, the diffusion degree of Ga of the gate insulating film including the 60-nm $SiO_2$ formed by PECVD alone is an order of magnitude greater. Therefore, it is preferable to use PEALD to form the $SiO_2$ film at the interface between the GaN layer and $SiO_2$ film in order to suppress Ga diffusion to the formed $SiO_2$ film.

In the case where the gate insulating film is formed to have the double-layer structure including an $Al_2O_3$ film formed by thermal ALD and a $SiO_2$ film formed by plasma-enhanced CVD, it is advantageous in terms of film quality improvement to perform radical oxidation by using microwave plasma on the outermost surface of the $Al_2O_3$ film for a predetermined period of time between formation of the $Al_2O_3$ film and formation of the $SiO_2$ film. The outermost surface of the $Al_2O_3$ film described herein is the top surface of the $Al_2O_3$ film in contact with the $SiO_2$ film and corresponds to the surface 16m in FIG. 16.

Figure 23:
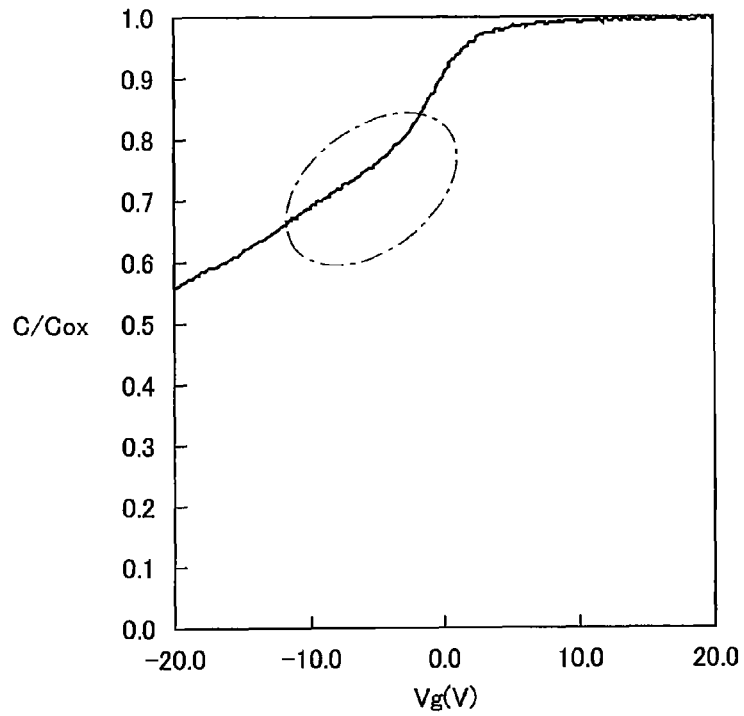
FIG. 23 is a graph showing C-V curves of a semiconductor device fabricated through a fabrication method according to yet another embodiment of the invention, the method not including radical oxidation between formation of an $Al_2O_3$ film and formation of a $SiO_2$ film.
Figure 24:
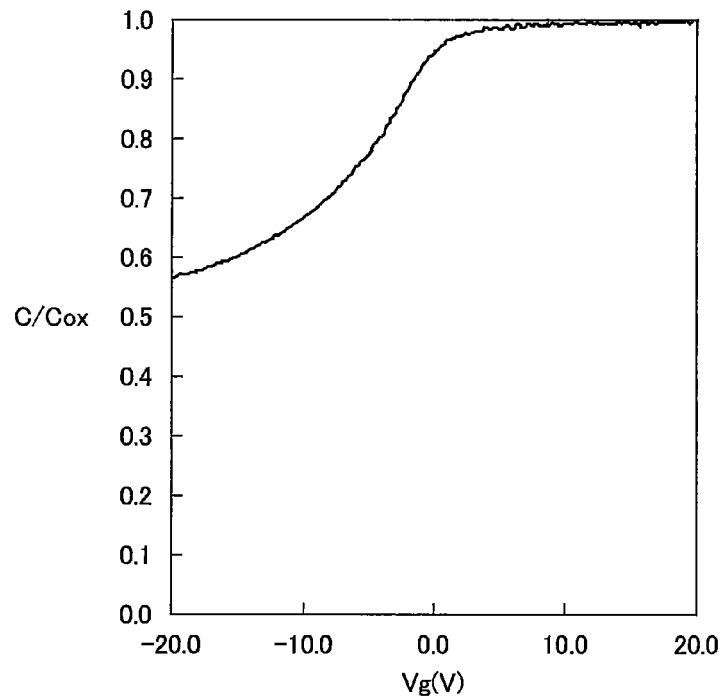
FIG. 24 is a graph showing C-V curves of a semiconductor device fabricated through a fabrication method according to yet another embodiment of the invention, the method including radical oxidation between formation of an $Al_2O_3$ film and formation of a $SiO_2$ film for 20 seconds.
Figure 25:
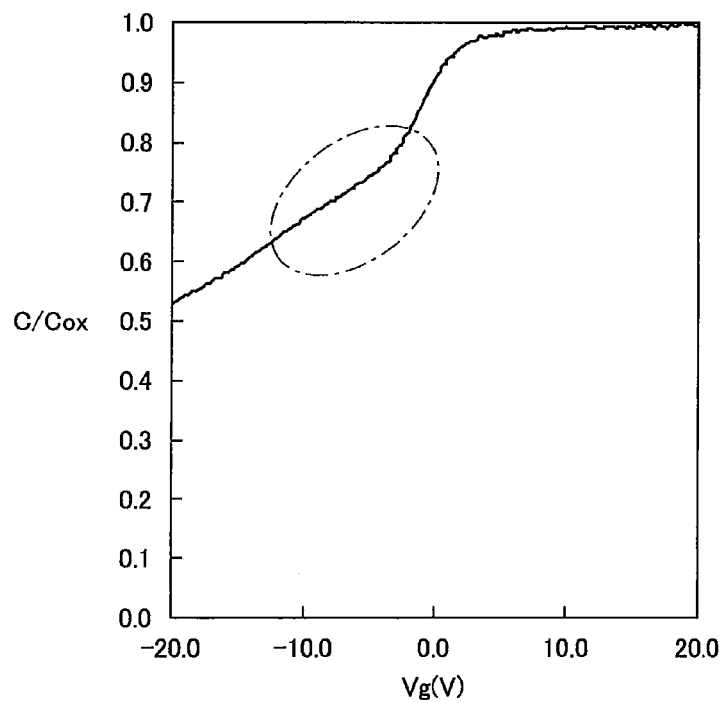
FIG. 25 is a graph showing C-V curves of a semiconductor device fabricated through a fabrication method according to yet another embodiment of the invention, the method including radical oxidation between formation of an $Al_2O_3$ film and formation of a $SiO_2$ film for 20 seconds.
Figure 26:
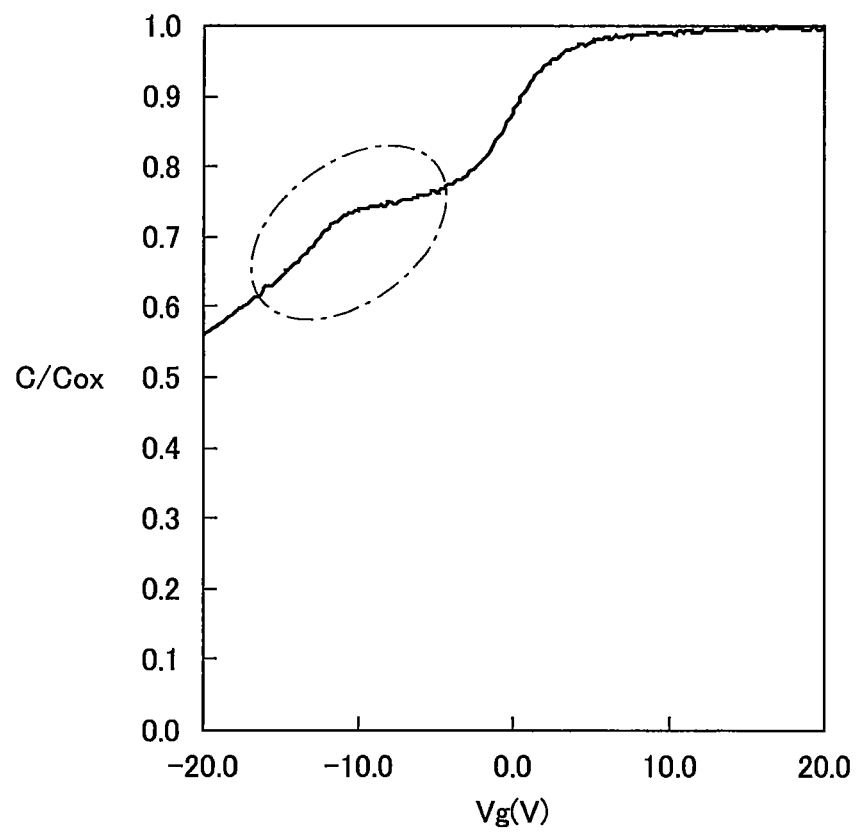
FIG. 26 is a graph showing C-V curves of a semiconductor device fabricated through a fabrication method according to yet another embodiment of the invention, the method including radical oxidation between formation of an $Al_2O_3$ film and formation of a $SiO_2$ film for 7 minutes.

FIGS. 23, 24, 25 and 26 are graphs showing the C-V characteristics of semiconductor devices fabricated by the methods according to yet other embodiments of the present invention. The semiconductor devices in FIGS. 23 to 26 have a gate insulating film including a 5-nm $Al_2O_3$ film formed on the upper surface of a GaN layer by thermal ALD and a 60-nm $SiO_2$ film formed on the upper surface of the $Al_2O_3$ film by plasma-enhanced CVD. FIG. 23 shows the C-V characteristics of the semiconductor device formed without radical oxidation between formation of the $Al_2O_3$ film and formation of the $SiO_2$ film. FIG. 24 shows the C-V characteristics of the semiconductor device formed with 20-second radical oxidation between formation of the $Al_2O_3$ film and formation of the $SiO_2$ film. FIG. 25 shows the C-V characteristics of the semiconductor device formed with 3-minute radical oxidation between formation of the $Al_2O_3$ film and formation of the $SiO_2$ film. FIG. 26 shows the C-V characteristics of the semiconductor device formed with 7-minute radical oxidation between formation of the $Al_2O_3$ film and formation of the $SiO_2$ film. In FIGS. 23 to 26, the vertical axis represents C/Cox ratio, while the horizontal axis represents gate voltage Vg (V). The measurement was conducted under the following conditions: environment temperature was 150° C.; frequency was 1 MHz; measured area was $4.52 \times 10^{-4}$ $cm^2$; and gate voltage ranged from −20 V to +20 V. A preferable line of C/Cox values plotted along the vertical axis is desired to increase without inflection points so as to draw a moderate curve with an increase of voltage applied to the gate electrode. A gate insulating film that exhibits such a curve is considered to have an excellent leakage characteristic and therefore have excellent film quality.

Referring to FIG. 23 in the case where radical oxidation has not been performed at all, a minor inflection point is seen in the area circled by a dot-and-dash line in FIG. 23, more specifically, in the area within which Vg is approximately −4.0 to −3.0 V and C/Cox is 0.7 to 0.8. Referring to FIG. 25 in the case where radical oxidation has been performed for three minutes, a minor inflection point is also seen in almost the same area circled by a dot-and-dash line in FIG. 23. Referring to FIG. 26 in the case where radical oxidation has been performed for seven minutes, a major inflection point is seen in the area circled by a dot-and-dash line in FIG. 26, more specifically in the area within which Vg is approximately −12.0 to −8.0 V and C/Cox is 0.7 to 0.8.

On the other hand, in the case where radical oxidation has been performed for 20 seconds with reference to FIG. 24, any recognizable inflection point is not seen in the graph, but the C/Cox value increases so as to draw a moderate curve with an increase of voltage applied to the gate electrode. In this embodiment, therefore, it is preferable to perform radical oxidation for approximately 20 seconds between formation of the $Al_2O_3$ film and formation of the $SiO_2$ film. It is noted that the period of time required for radical oxidation is determined based on the thickness of the $Al_2O_3$ film and $SiO_2$ film to be formed and some other factors.

Although the GaN-based semiconductor device in the above-described embodiments is an AlGaN/GaN hybrid MOS-HFET device, the present invention is not limited thereto, and can be applied to semiconductor devices with a single-layer GaN semiconductor layer or heterojunction hybrid MOS-HFET devices composed of a GaN layer and the other kind of gallium compound.

Although the plasma processing in the above-described embodiments is performed by using microwave plasma with an electron temperature of lower than 1.5 eV and an electron density of higher than $1 \times 10^{11}$ $cm^{-3}$, the present invention is not limited thereto and can be used in areas where the electron density of plasma is lower than $1 \times 10^{11}$ $cm^{-3}$.

Although the plasma processing in the above-described embodiments is performed with microwaves generated by an RLSA using a slot antenna plate, the present invention is not limited thereto and can use a microwave plasma processing apparatus having a comb antenna or a microwave plasma processing apparatus that radiates microwaves from its slots to generate surface wave plasma.

The foregoing has described the embodiments of the present invention by referring to the drawings. However, the invention should not be limited to the illustrated embodiments. It should be appreciated that various modifications and changes can be made to the illustrated embodiments within the scope of the appended claims and their equivalents.

REFERENCE SIGNS LIST

11: semiconductor device material; 12: substrate; 13: GaN layer; 14, 14a, 14b: AlGaN layer; 15: field oxide film; 16a, 16b, 16c, 16d, 16e, 16f, 16g, 16h, 16i, 16j, 16k, 16m: surface; 17: resist layer; 18, 21a, 21b: opening; 19, 19a, 19b, 19c: gate insulating film; 20: gate electrode; 22a, 22b: ohmic electrode; 23a, 23b, 23c: semiconductor device, 24a: $Al_2O_3$ film; 24b, 24c, 24d: $SiO_2$ film; 26, 27: area; 29: temperature regulating mechanism; 31: plasma processing apparatus; 32: chamber; 33, 46, 47: gas supplying section; 34: holding stage; 35: microwave generator; 36: dielectric window; 37: slot antenna plate; 38: dielectric member; 39: plasma generation mechanism; 40: slot; 41: bottom; 42: sidewall; 43: exhaust hole; 44: cover; 45: O ring; 48: lower surface, 49 gas supply system; 30, 50: gas supply hole; 51: cylindrical support section; 52: cooling jacket; 53: matching mechanism; 54: mode transducer; 55: waveguide; 56: coaxial waveguide; 57 recess, 58: RF generator, 59: matching unit; 60: circulation path; 61: electrode.

The invention claimed is:

1. A method for fabricating a semiconductor device including GaN (gallium nitride) that composes a semiconductor layer, the method comprising:
    forming a first nitride layer on a substrate;
    forming a second nitride layer on the first nitride layer;
    forming a field oxide layer on the second nitride layer;
    forming a gate insulating film in which an $Al_2O_3$ film is formed to penetrate the field oxide layer, the first nitride layer, and the second nitride layer, the $Al_2O_3$ film is subject to radical oxidation, and
    then a $SiO_2$ film is formed by using microwave plasma, the $SiO_2$ film penetrating the field oxide layer and the second nitride layer only, and the $SiO_2$ film located between the $Al_2O_3$ film and a gate electrode, wherein
    the gate electrode is at least partially located in an opening of the $SiO_2$ film of the gate insulating film, and
    in the forming the gate insulating film, the microwave plasma is generated by using microwaves at a frequency of 2.45 GHz by using a radial line slot antenna.

2. The method for fabricating the semiconductor device according to claim 1, wherein the forming the gate insulating film includes a plasma-enhanced CVD process using microwave plasma.

3. The method for fabricating the semiconductor device according to claim 1, wherein the forming the gate insulating film includes a plasma-enhanced ALD process using microwave plasma.

4. The method for fabricating the semiconductor device according to claim 1, wherein the forming the gate insulating film includes forming a film in which the $SiO_2$ film and the $Al_2O_3$ film are stacked.

5. The method for fabricating the semiconductor device according to claim 4, wherein the forming the gate insulating film includes forming the $Al_2O_3$ film by a thermal ALD process and forming the $SiO_2$ film by a plasma-enhanced CVD process.

6. The method for fabricating the semiconductor device according to claim 1, wherein the forming the gate insulating film includes forming the $SiO_2$ film to form the gate insulating film and includes forming the $SiO_2$ film by both plasma-enhanced CVD and plasma-enhanced ALD processes.

7. The method for fabricating the semiconductor device according to claim 1, wherein the forming the gate insulating film includes introducing gas containing nitrogen oxides (NOx) for processing.

8. The method for fabricating the semiconductor device according to claim 1, wherein the plasma-enhanced ALD process includes introducing deposition gas containing BTBAS (bis-tertiaryl-buthyl-amino-silane) onto the nitride layer.

9. The method for fabricating the semiconductor device according to claim 1, wherein the forming the gate insulating film includes successively performing the plasma-enhanced ALD and plasma-enhanced CVD processes.

10. The method for fabricating the semiconductor device according to claim 1, wherein the first nitride layer and the second nitride layer have a heterojunction.

11. The method for fabricating the semiconductor device according to claim 10, wherein the forming the first nitride layer and the second nitride layer includes forming a nitride layer composed of at least one of a GaN layer and an AlGaN (aluminum gallium nitride) layer.

* * * * *